(12) United States Patent
Blednov

(10) Patent No.: US 10,097,138 B2
(45) Date of Patent: Oct. 9, 2018

(54) DOHERTY INPUT POWER SPLITTER AND LINEARIZATION METHOD

(71) Applicant: NXP USA, Inc., Austin, TX (US)

(72) Inventor: Igor Blednov, Toulouse (FR)

(73) Assignee: NXP USA, Inc., Austin, TX (US)

( * ) Notice: Subject to any disclaimer, the term of this patent is extended or adjusted under 35 U.S.C. 154(b) by 19 days.

(21) Appl. No.: 15/353,791

(22) Filed: Nov. 17, 2016

(65) Prior Publication Data

US 2018/0034418 A1   Feb. 1, 2018

(30) Foreign Application Priority Data

Jul. 26, 2016   (EP) .................................... 16305959

(51) Int. Cl.
*H03F 3/68* (2006.01)
*H03F 1/02* (2006.01)
*H03F 3/195* (2006.01)
*H03F 3/21* (2006.01)
*H03F 1/56* (2006.01)

(52) U.S. Cl.
CPC ........... *H03F 1/0288* (2013.01); *H03F 1/565* (2013.01); *H03F 3/195* (2013.01); *H03F 3/211* (2013.01); *H03F 2200/451* (2013.01); *H03F 2203/21103* (2013.01); *H03F 2203/21106* (2013.01); *H03F 2203/21112* (2013.01)

(58) Field of Classification Search
CPC .............................. H03F 1/0288; H03F 1/565
USPC ............................................. 330/124 R, 295
See application file for complete search history.

(56) References Cited

U.S. PATENT DOCUMENTS

| 8,228,123 | B2 | 7/2012 | Blednov |
| 8,354,882 | B2 | 1/2013 | Blednov |
| 8,410,853 | B2 | 4/2013 | Blednov |
| 8,653,890 | B1 * | 2/2014 | Ahmed ................. H03F 1/0222 |
| | | | 330/107 |
| 8,710,924 | B2 | 4/2014 | Van Der Zanden et al. |

* cited by examiner

*Primary Examiner* — Khanh V Nguyen
*Assistant Examiner* — Khiem Nguyen

(57) ABSTRACT

Embodiments of a Doherty amplifier device are provided, including a first amplifier stage having a first gain; a second amplifier stage having a second gain that is less than the first gain; and an input power splitter coupled to inputs of the first and second amplifier stages, wherein the input power splitter includes either an inductive element, a capacitive element, or both coupled between the inputs of the first and second amplifier stages, and a resistive element coupled to the input of the second amplifier stage, the input power splitter respectively delivers first and second power levels to inputs of the first and second amplifier stages, and the resistive element is configured to tune gain linearity of the Doherty amplifier device by increasing the second power level to be greater than the first power level, based on a ratio of the second gain to the first gain.

20 Claims, 9 Drawing Sheets

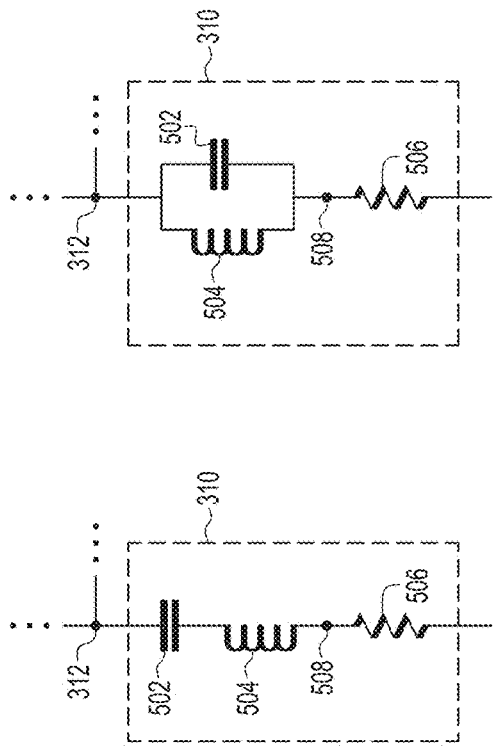
FIG. 5A
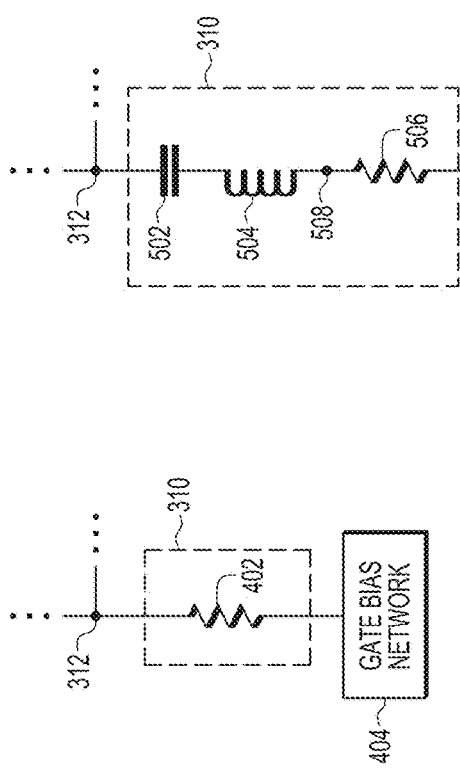
FIG. 5B
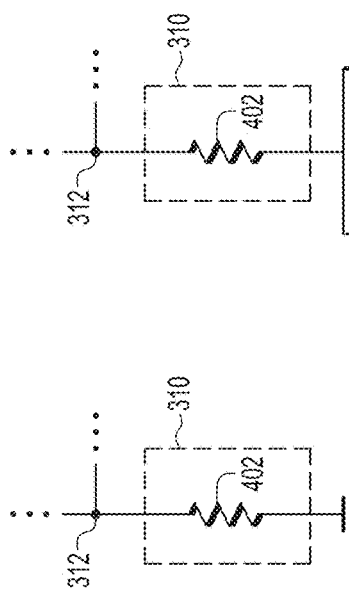
FIG. 5C
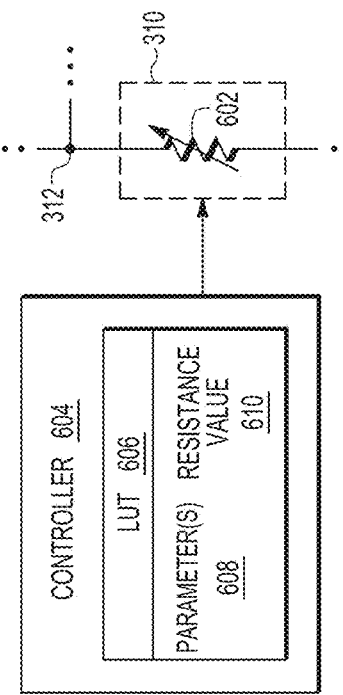
FIG. 4A
FIG. 4B
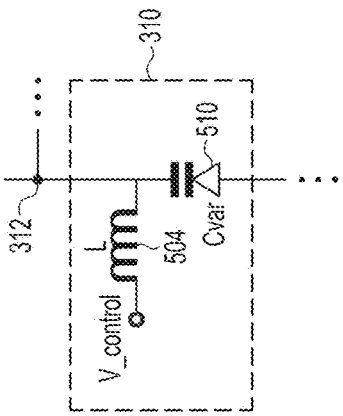
FIG. 6

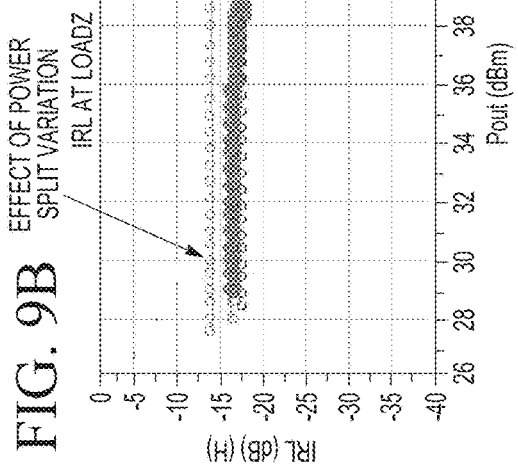
FIG. 9A
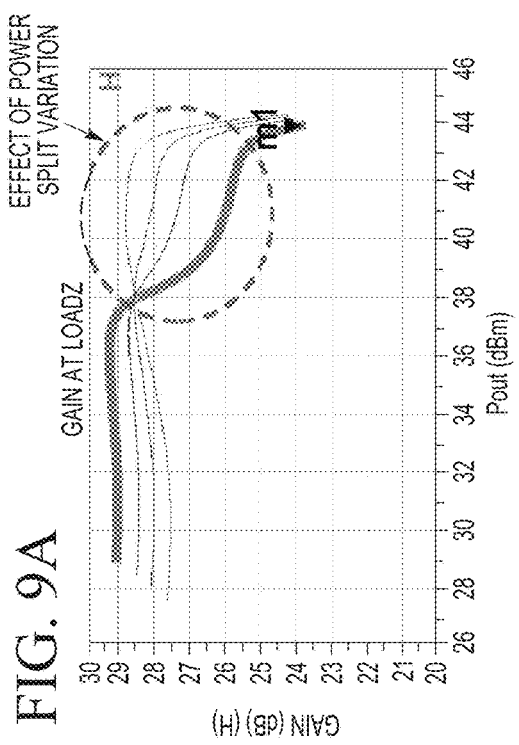
FIG. 9C
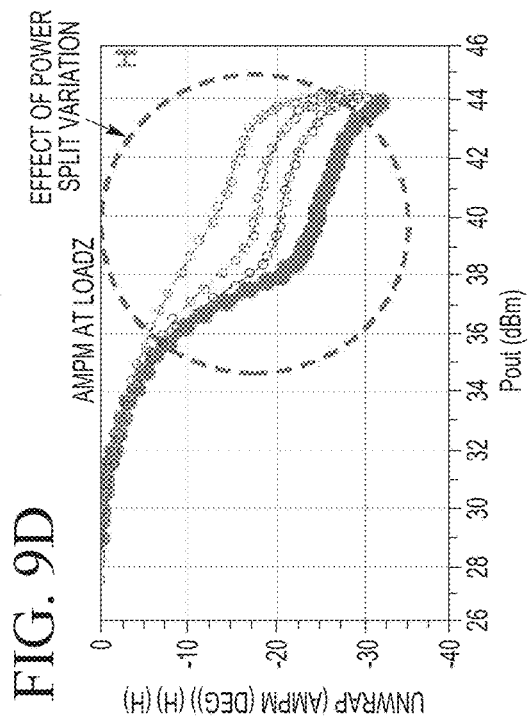
FIG. 9B
FIG. 9D
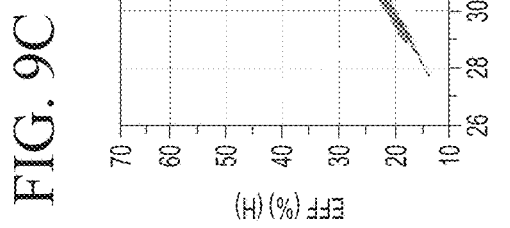

ized as having a center frequency between the upper and lower frequencies that is approximately equally spaced from each of the upper and lower frequencies. The amplitude of the RF carrier signal may also be modulated according to an envelope function, where the envelope of the signal has an envelope amplitude (or maximum overall amplitude of the signal).

DOHERTY INPUT POWER SPLITTER AND LINEARIZATION METHOD

CROSS-REFERENCE TO RELATED APPLICATIONS

This application claims priority under 35 U.S.C. § 119 of European Patent application no. 16305959.5, filed on Jul. 26, 2016, the contents of which are incorporated by reference herein.

BACKGROUND

Field

This disclosure relates generally to electronic circuits including radio frequency (RF) power amplifiers, and more specifically, to a Doherty amplifier device with an input power splitter circuit that is adjustable.

Related Art

The conventional Doherty amplifier is extensively used in wireless communication, as it provides high efficiency for modern modulation techniques. The conventional Doherty amplifier is also an attractive candidate for integration in a semiconductor device, due to its architectural simplicity, availability of components and to its operation that involves an analog-signal processing technique. However, semiconductor process abnormalities may occur during fabrication of integrated circuits that implement conventional Doherty amplifiers, such as differences in the thickness of semiconductor gate oxide layer materials or misalignment of contacts, for example. These abnormalities may result in the conventional Doherty amplifiers having spread active device parameters, which may greatly impact the performance of the conventional Doherty amplifier in semiconductor device mass production.

BRIEF DESCRIPTION OF THE DRAWINGS

The present invention may be better understood, and its numerous objects, features, and advantages made apparent to those skilled in the art by referencing the accompanying drawings.

FIGS. 4A, 4B, 5A, 5B, 5C, and 6 illustrate circuit diagrams depicting a portion of the adjustable input power splitter circuit that includes a resistive element, according to some embodiments.

FIGS. 8A, 8B, 8C, 8D, 8E, 8F, 9A, 9B, 9C, 9D, 10A, 10B, 10C, and 10D illustrate graphical plots of example characteristics of a Doherty amplifier device at different adjustments of the input power splitter circuit, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Figure 1:
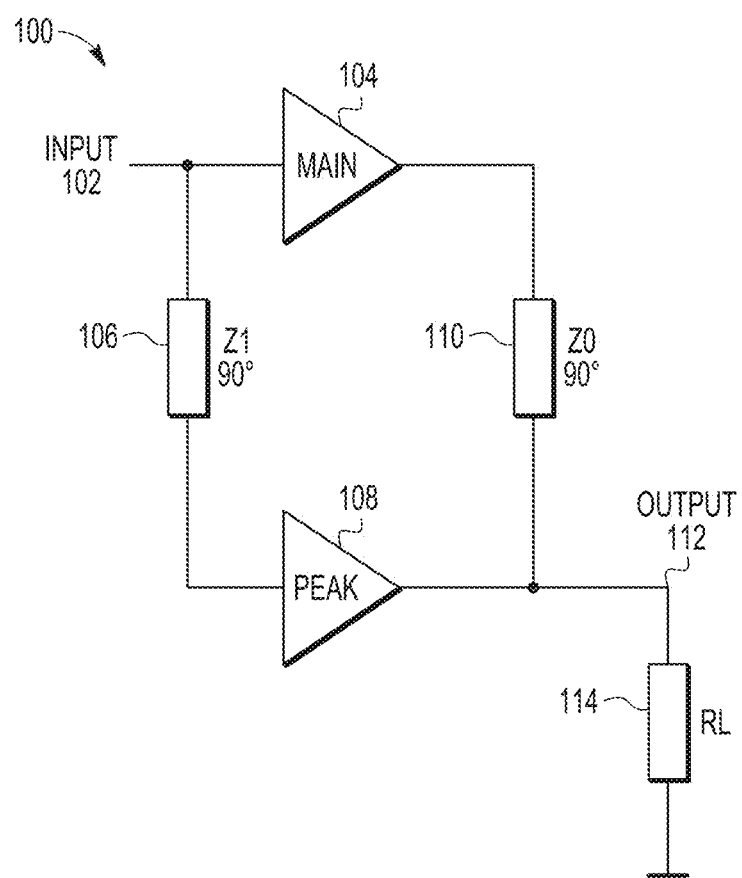
FIGS. 1 and 2 illustrate circuit diagrams depicting known Doherty amplifiers.

Classical Doherty amplifiers are used extensively in mobile communication. Operation of a classical Doherty amplifier is discussed in connection with FIG. 1, which depicts a classical Doherty amplifier 100 that includes two amplifying devices arranged in parallel between an input node 102 and an output node 112 of the Doherty amplifier 100. One amplifying device, or main amplifier stage 104, is biased to operate in a class AB amplifier mode (e.g., has gate bias conditions that implement a power dependent conduction angle between 180 to 360 degrees), and the other amplifying device, or peak amplifier stage 108, is biased to operate in a class C amplifier mode (e.g., has gate bias conditions that implement a power dependent conduction angle between 90 to 180 degrees). Main amplifier stage 104 provides amplification for lower level signals, or signals below average power level, within an operational frequency band of the Doherty amplifier 100, and both main and peak amplifier stages 104 and 108 provide amplification for higher level signals, or signals above average power level. A given input signal received by the Doherty amplifier 100 is an RF (radio frequency) carrier signal that has a frequency that falls within the operational frequency band of the Doherty amplifier 100. As used herein, a "frequency band" means a range or section of frequencies of the spectrum of radio communication frequencies, where the frequency band is delimited by an upper and lower frequency and characterized as having a center frequency between the upper and lower frequencies that is approximately equally spaced from each of the upper and lower frequencies. The amplitude of the RF carrier signal may also be modulated according to an envelope function, where the envelope of the signal has an envelope amplitude (or maximum overall amplitude of the signal).

In a symmetrical Doherty amplifier structure, main and peak amplifier stages 104 and 108 are of equal size or have a same power capability, and usually receive signals of equal power (e.g., a power division ratio of 1:1). In an asymmetrical Doherty amplifier structure, main and peak amplifier stages 104 and 108 have different power capabilities, where the peak amplifier stage has a larger power capability than the main amplifier stage that is up to twice that of the main amplifier stage, allowing operation with acceptable linearity.

An input signal (such as an RF carrier signal) at node 102 is split into two portions, usually having non-equal power, before being fed to main and peak amplifier stages 104 and 108 to compensate for different power gain of devices operating in different classes, such as class AB and class C. A phase shifter 106 delays the signal fed to peak amplifier stage 108 by approximately 90 degrees compared to the phase of the signal fed to main amplifier stage 104. An impedance inverter 110 is placed between the outputs of main amplifier stage 104 and peak amplifier stage 108. The output of main amplifier stage 104 is delayed by 90 degrees via impedance inverter 110 and is combined with the output of peak amplifier stage 108 at output 112 of the Doherty amplifier 100, where the outputs of main and peak amplifier stages 104 and 108 are combined in phase. Output node 112 is coupled to a load RL 114. Impedance inverter 110, also referred to as a "Doherty combiner," has a characteristic impedance Z0 equal to the optimum load for main amplifier stage 104, in order to maximize the output power delivered by main amplifier stage 104 to the output 112 at peak power level of Doherty amplifier 100.

In a first operational state of Doherty amplifier 100, the input signal power level is above a power threshold level of peak amplifier stage 108 and both amplifier stages 104 and 108 are in an "on" state, where the output signal power level of the Doherty amplifier is at its maximum. The signals at the outputs of main and peak amplifier stages 104 and 108 are at their peak power levels and differ 90 degrees in phase. Impedance inverter 110 at the peak power level of the Doherty amplifier 100 is terminated by its characteristic impedance Z0 and does not transform the output impedance of main amplifier stage 104, instead only changing the phase of the output signal of main amplifier stage 104. Both amplifier stages 104 and 108 see their ideal load for generating maximum output signal power in this operational state.

In a second operational state of Doherty amplifier 100, the input signal power level is at or below the power threshold level of peak amplifier stage 108 (i.e., below the Doherty amplifier back-off power level), where the gain of peak amplifier stage 108 is ideally zero. Peak amplifier stage 108 delivers no power to output 112 and is effectively in an "off" state because it is biased in such a way that it only starts to produce an output when the input signal power level is above the power threshold level. The load impedance of peak amplifier stage 108 ideally is infinitely high, while the load impedance for main amplifier stage 104 is maximum and (depending on asymmetry of the Doherty amplifier structure) may be in the range of two to three times the optimum load impedance Z0 for main amplifier stage 104. Main amplifier stage 104 operates up to its maximum output voltage at around threshold power, allowing for operation with highest power efficiency. Since peak amplifier stage 108 is off, power consumption is reduced as compared with the first operational state. Also, since main amplifier stage 104 is the only amplifier operating in this state and is working up to a two-times higher load line (e.g., in a symmetrical Doherty amplifier structure), current consumption is reduced as compared with the first operational state.

Between these two operational states, from 6 dB back-off power up to the peak power level, the load of main amplifier stage 104 is modulated by peak amplifier stage 108 in such a way that main amplifier stage 104 operates at its maximum voltage swing. The impedance seen by main amplifier stage 104 will gradually change from a double load line at the power threshold level to its characteristic impedance at peak power level.

Doherty amplifiers also include some means for distributing or splitting power delivered to the main and peak amplifier stages. One example power splitter is discussed in connection with FIG. 2, which illustrates a circuit diagram depicting a known Doherty amplifier 200, which has main amplifier stage 104 and peak amplifier stage 108 arranged in parallel between input node 102 and output node 112 of Doherty amplifier 200. Input node 102 is coupled to the inputs of main and peak amplifier stages 104 and 108 via an input matching network 234. The outputs of main and peak amplifier stages 104 and 108 are coupled to output node 112 via an output power combining network 236.

Input node 102 is coupled to the input of main amplifier stage 104 by a branch of input matching network 234, which includes a capacitance 202, an inductance 204, a capacitance 206, and an input capacitance 208 of main amplifier stage 104. Input node 102 is coupled to the input of peak amplifier stage 108 by another branch of input matching network 234, which includes an inductance 210, an inductance 214, a capacitance 216, and an input capacitance 218 of peak amplifier stage 108. Capacitances 208 and 218 are formed by the respective gate-source capacitances of main and peak amplifier stages 104 and 108. Input matching network 234 operates as a low-pass filter prototype and provides input matching for the main and peak amplifier stages 104 and 108, implements a 90 degree phase shift of the signals provided to amplifier stages 104 and 108, and provides a fixed non-equal input power distribution (e.g., a symmetrical power distribution) to amplifier stages 104 and 108, which is not able to provide optimal power split at every frequency of the entire band.

The output of main amplifier stage 104 is coupled to output 112 by a branch of output combining network 236, which includes output capacitance 220, inductance 222, capacitance 224, and inductance 226. The output of peak amplifier stage 108 is coupled to output 112 by another branch of output combining network 236, which includes output capacitance 228, inductance 230, and capacitance 232. Capacitances 220 and 228 are formed by the respective parasitic drain-source capacitances of main and peak amplifier stages 104 and 108. The output of main amplifier stage 104 is coupled to signal-ground via a series arrangement of inductance 222 and capacitance 224. Similarly, the output of peak amplifier stage 104 is coupled to signal-ground via a series arrangement of inductance 230 and 232. These series arrangements are convenient for DC-biasing main and peak amplifier stages 104 and 108 and to prevent leakage of the RF signal into the power supply network by means of providing a very low, or negligible, impedance at the low frequency of base band modulation and a very high impedance, or practically an "open" circuit, at the carrier RF frequency.

Capacitance 220, inductance 226, and capacitance 228 also implement a low-pass C-L-C network, which is used as an output combiner (e.g., of a symmetrical Doherty amplifier). If properly built (i.e., the proper capacitance and inductance values are selected), this C-L-C network is equivalent to an impedance inverter and provides a 90 degree phase shift of the signal and implements the optimal characteristic impedance Z0 (e.g., providing the functionality of a quarter-wavelength transmission line).

As semiconductor devices become more complex, integration of components to minimize the circuitry area becomes more important. It is also noted that a portion of Doherty amplifier 200 may be implemented as an integrated circuit 238 on a semiconductor substrate, which includes components 202, 204, 206, 208, 210, 214, 216, and 218, as well as amplifier stages 104 and 108. A number of integrated circuits 238 may be mass produced, such as being fabricated on a semiconductor wafer and singulated into a semiconductor die or substrate.

Due to semiconductor process abnormalities that may occur during fabrication of integrated circuits, components of the integrated circuits, such as the main and peak amplifier stages, have some production spread including but not limited to variations in gate oxide thickness, in shape of the gate, in doping levels in the channel of the gate, and the like. These variations can affect the threshold voltage (Vt) of the main and peak amplifier stages and accordingly poorly affects threshold power level and peak power gain. These abnormalities may greatly affect the performance of each of these mass-produced amplifier stages in a semiconductor device, such as by causing poor gain linearity due to mismatched components. Also, when the required operational frequency band is relatively wide (e.g., greater than 15 to 30%), such an input power distribution network is not capable of (1) maintaining an optimal input power split at every frequency, or of (2) compensating for a non-ideal output combiner, which does not allow or enable potential instant bandwidth to be achieved.

It is noted that the minimal gain linearity (or so called "raw linearity") of a Doherty amplifier device is important for mobile communications. Gain linearity is a characteristic of the Doherty amplifier device based on the relationship between input power and output power of the Doherty amplifier device. A Doherty amplifier device is intended to have an ideal gain response that exhibits a linear relationship (e.g., graphed as a straight line) between input power and output power, based on the gain of the amplifier stages used in the Doherty amplifier device. However, since the peak amplifier stage is biased at a lower bias than the main amplifier stage, the peak amplifier stage has a smaller gain than the main amplifier stage, resulting in non-ideal gain linearity (or roll-off, where output power is less than theoretical linear operation). The gain of the peak amplifier stage is usually 2 to 5 dB less than the gain of the main amplifier stage, depending on the selected conduction angle and bias point. Also, the class C operation of a power device (e.g., like an FET (field effect transistor) or BJT (bipolar junction transistor)) exhibits power dependent input impedance, which additionally affects the power split ratio and phase difference of signals between main and peak device. It is noted that up to 75% of the Doherty amplifier device's gain linearity may be affected by the distribution of power and phase between the main and peak amplifier stages. Since the gain linearity is so greatly affected by the input power distribution, an asymmetrical input power distribution can be used to compensate for the difference between the gain of the main amplifier stage and the gain of the peak amplifier stage, and also similarly compensate for phase error and ensure that both amplifier stages generate the same output power and phase at peak power levels, securing the best output power combining conditions with minimum power and efficiency loss. Stated another way, the resulting differences in gain and in phase error between the main and peak amplifier stages are compensated for by a corresponding difference in the power and phase distribution between the inputs of the main and peak amplifier stages.

Figure 2:
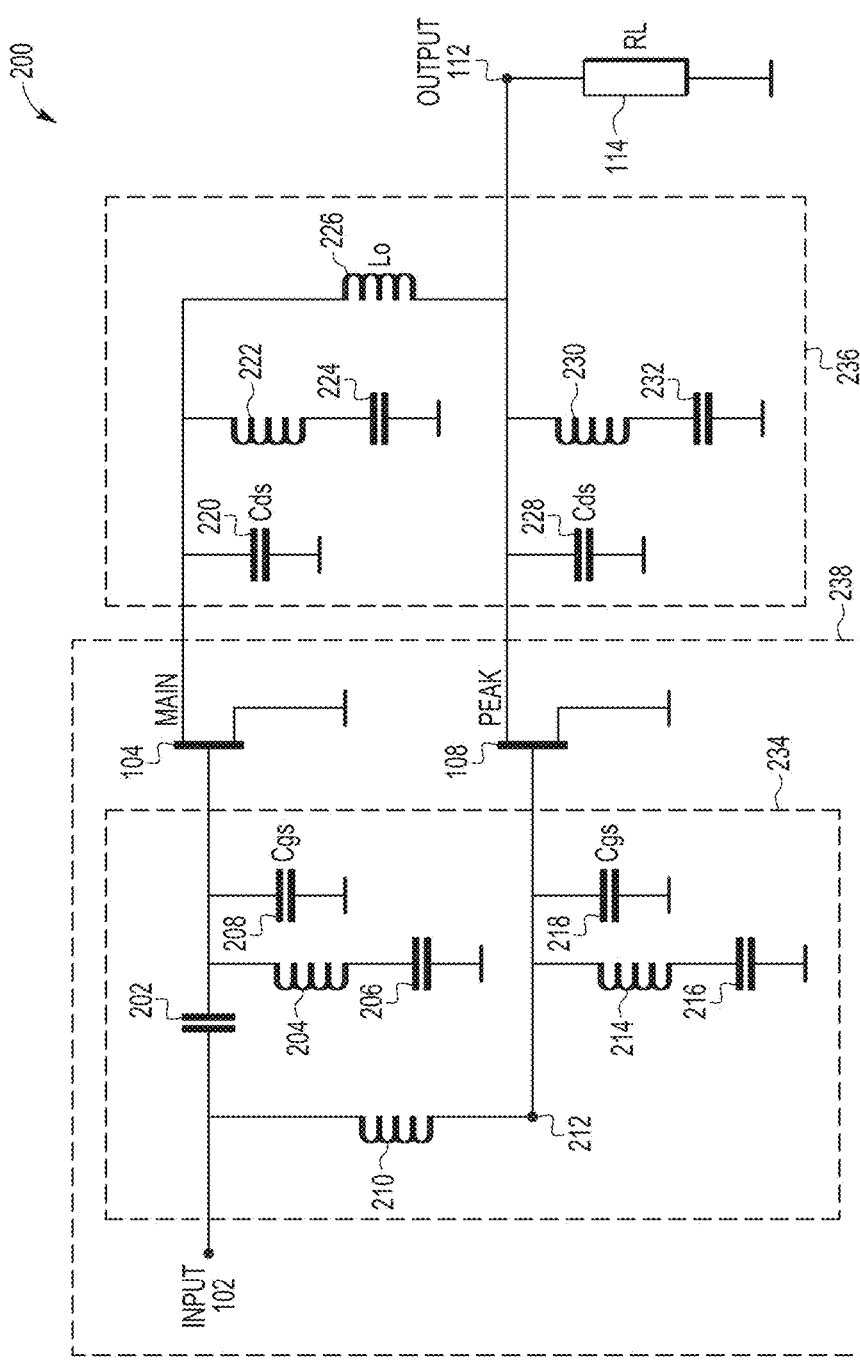

It is noted that the known Doherty amplifier device 200 as illustrated in FIG. 2 still requires fine tuning of gain linearity, such as by biasing the main and peak amplifier stages. However, it is difficult to continue such biasing during runtime operation of the known Doherty amplifier device 200 to maintain consistent performance during the different operational states of the device 200.

The present disclosure provides a Doherty amplifier device that includes an adjustable input power splitter, which provides a quick and easy way to dynamically tune, for an instant power level, gain linearity of a Doherty amplifier device for best overall performance. In one approach where only power split adjustment is needed, the adjustable input power splitter includes a resistive element that has a resistive value selected based on the difference between the required gain of the main amplifier device and the required gain of the peak amplifier device. The resistive element implements a power division ratio that adjusts the power levels distributed to the main and peak amplifier devices, thereby compensating the peak amplifier device having a lower gain with a greater power level and tuning gain linearity of the Doherty amplifier device. The additional power delivered to the peak amplifier corresponds to the lower gain of the peak amplifier device. Different resistive values can be used to tune gain linearity (i.e., to adjust the gain response of the Doherty amplifier toward a more linear relationship of input power to output power) in different scenarios. For example, an optimal resistive value can be selected based on one or more present operational parameters of the Doherty amplifier device, which includes a ratio of the peak amplifier gain to the main amplifier gain, a present frequency of a presently received input signal, a present envelope amplitude of the presently received input signal, a present operational power level or state, or any combination thereof. A new optimal resistive value can be selected each time that a change occurs in any of the present operational parameters of the Doherty amplifier device (e.g., during runtime when a presently received input signal is received by the Doherty amplifier device), or may be selected once to tune the Doherty amplifier device on the production line before use in a customer environment (e.g., before runtime when a presently received test input signal is received by the Doherty amplifier device). Accordingly, the Doherty amplifier device can be dynamically tuned for optimal performance in any one of a variety of scenarios.

In some embodiments, the resistive element is external to an integrated circuit in which a portion of the Doherty amplifier device is implemented. For example, the resistive element may be a removable and replaceable resistor for on-the-fly tuning. Also, in other embodiments, the resistive element may also include either a constant or variable capacitance, a constant or variable inductance, or both, which may be connected either in parallel or in series to said external resistive termination, providing required phase error compensation or correction for power level, frequency of operation, or both. The input power splitter may also include either a constant or variable inductance, a constant or variable capacitance, or both. In some embodiments, the inductance (if present) of the input power splitter is also adjustable to aid in tuning out phase error. In other embodiments, the capacitance (if present) of the input power splitter is also adjustable to aid in phase shifting or tuning out phase error.

The adjustable input power splitter is effectively an ideal power splitter because it provides stable input impedance, stable output impedance, stable group delay, and stable phase characteristics for variation of the external splitter resistive termination. The stable group delay and stable phase characteristics maintain the phase shift between the main and peak amplifier stages even as the gain linearity is tuned, in order for the output signals of the main and peak amplifier stages to be combined synchronously in phase at an output node of the Doherty amplifier device. The adjustable input power splitter may also tune and optimize efficiency of the Doherty amplifier device, while balancing concerns for high efficiency with high gain linearity.

The adjustable input power splitter provides wideband operation due to a large range of power division adjustments from 1 dB to 6 dB available over the entire operational frequency bandwidth ranging from 2 GHz to 3 GHz. The adjustable input power splitter is also small (as compared to the area of the integrated main and peak amplifiers) and provides external access to the resistive element for tuning. The present disclosure may be applied to symmetric or asymmetric Doherty amplifier devices. The present disclosure is further discussed below in connection with the remaining figures.

Example Embodiments

Figure 3:
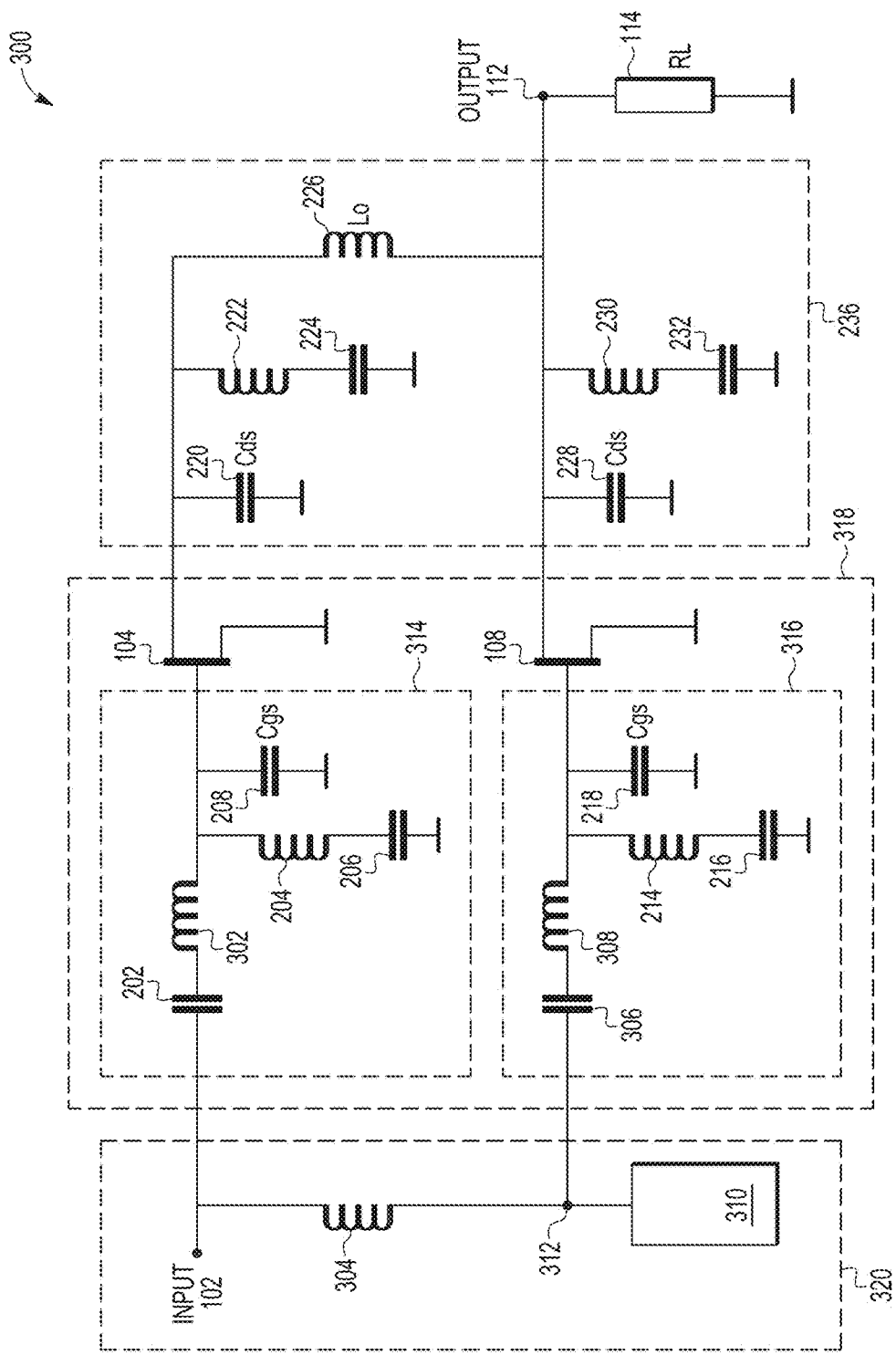
FIG. 3 illustrates a circuit diagram depicting an example Doherty amplifier device that includes an adjustable input power splitter circuit in which the present disclosure is implemented, according to some embodiments.

FIG. 3 illustrates a circuit diagram depicting an example Doherty amplifier device that includes an adjustable input power splitter circuit. The circuit diagram may also define a cell that can be used as a building block to create a high-power Doherty amplifier device by means of an array of such cells arranged in parallel (e.g., for an amplifier device that includes multiple Doherty amplifiers of FIG. 3).

Main amplifier stage 104 and peak amplifier stage 108 (also referred to as main and peak devices or as active devices) each receive a respective input signal from nodes of input power splitter 320 via parallel input pre-matching networks 314 and 316. In the embodiment shown, input pre-matching networks 314 and 316 and main and peak amplifier stages 104 and 108 are implemented as an integrated circuit on a semiconductor die 318 or semiconductor substrate. Input pre-matching networks 314 and 316 compensate input capacitance Cgs of the device (shown as capacitances 208 and 218) at central frequency fo of the band. Required operational bandwidth of the Doherty amplifier may be controlled by quality factor of compensation inductance in networks 314 and 316, which also will define the real part of input impedance Re(Zin) of the main and peak devices. Accordingly, series inductance values of 302 and 308 and series capacitance values of 202 and 306 of networks 314 and 316 may be defined by expressions (1) and (2) below:

$$L_{ser} = 0.4(\text{Re}(Z_{ln}))^2 C_{gs} \quad (1)$$

$$C_{ser} = \frac{1.5 L_{comp}}{(\text{Re}(Z_{ln}))^2} \quad (2)$$

This also provides the required imaginary part of input impedance Im(Zin) of main and peak devices, which in combination with inductance 304 will result in an input 90 degree phase shift network equivalent to a low-pass C-L-C filter prototype. Inductance value of 304 may be defined by expression (3) below:

$$L = \frac{\text{Re}(Z_{ln})}{\pi f_0} \quad (3)$$

It is noted that expressions (1), (2), and (3) provide example values for use in the present disclosure, which can be modified if needed. For example, a larger regulation range may be required, such as in an asymmetrical Doherty amplifier configuration. If capacitance 202 is selected to be a smaller value, a larger portion of the input power from input node 102 will be delivered to the peak device through node 312. Also, the phase shift between the main and peak device inputs may be modified by selected values of inductance 304 and capacitance 306 or their combination. Similarly, the selected values for series inductances 302 and 308 will affect the desired frequency bandwidth.

Components of input power splitter 320 may be located on semiconductor die 318, off of die 318, or a combination thereof. In the embodiment shown, input power splitter 320 is located off of the semiconductor die 318 and the pre-matching networks 314 and 316 are connected to respective nodes 102 and 312 of the external part of the input power splitter 320 via external terminals. Components of output combining network 236 may be located on die 318, off of die 318, or a combination thereof. In the embodiment shown, output combining network 236 is located off of the semiconductor die 318. The outputs of main and peak amplifier stages 104 and 108 are also connected to nodes of output combining network 236 via external connections. External connections of the semiconductor die 318 are further discussed below in connection with FIG. 7. Other embodiments of input power splitter 320 are discussed below in connection with FIGS. 11A and 11B.

It is noted that the input pre-matching networks, output combiner network, and even the input power splitter in their entirety may be located on the semiconductor die 318 if the semiconductor substrate has low losses, for example, as when the semiconductor substrate is made of high resistivity semiconductor material. In one case, if this high quality integrated passive component or device (IPD) technology is available, the components of the pre-matching networks 314 and 316, input power splitter 320, and output combiner network 236 may be arranged on the same single die together with the active devices of the Doherty amplifier device, which decreases die size and device cost without significant degradation of device performance.

In the embodiment shown, main amplifier stage 104 receives its input signal via input pre-matching network 314 that includes a capacitance 202, an inductance 302, inductance 204, capacitance 206, and input capacitance 208. Inductance 204 and capacitance 206 are connected in series between the input of the main amplifier stage 104 and ground, which provides an initial input impedance transformation of main amplifier stage 104 to a required level over an operational frequency band of the Doherty amplifier device 300. In other words, input pre-matching network 314 partially tunes out input capacitance 208, or the gate-source capacitance of the main amplifier stage 104.

Capacitance 202 and inductance 302 are connected in series between node 102 of the input power splitter 320 and the input of main amplifier stage 104, which provides additional input impedance transformation of main amplifier stage 104 over the operational frequency band. Capacitance 202 also functions as a DC-blocking capacitor separating a DC gate bias of main amplifier stage 104 from peak amplifier stage 108. Together, components 202, 302, 204, and 208 of input pre-matching network 314 provide an input impedance Zin=1−j*1 as seen from node 102 (normalized values), and tunes input impedance over a wide operational frequency band.

Peak amplifier stage 108 receives its input signal via an input pre-matching network 316 that includes a capacitance 306, an inductance 308, inductance 214, capacitance 216, and input capacitance 218. Inductance 214 and capacitance 216 are connected in series between the input of peak amplifier stage 108 and ground, which provides an initial input impedance transformation of peak amplifier stage 108 to a required level over the operational frequency band, partially tuning out input capacitance 218, or the gate-source capacitance of peak amplifier stage 108.

Capacitance 306 and inductance 308 are connected in series between node 312 of the input power splitter 320 and the input of peak amplifier stage 108, which provides additional input impedance transformation of peak amplifier stage 108 over the operational frequency band. Capacitance 306 also functions as a DC-blocking capacitor separating a DC gate bias of peak amplifier stage 108 from main amplifier stage 104. Together, components 306, 308, 214, 216, and 218 of input pre-matching network 316 provide an input impedance Zin=1−j*1 as seen from node 312, and tunes input impedance over a wide operational frequency band. Blocking capacitances 206 and 216 also provide RF grounding of compensation inductances 204 and 214 that can be used as "cold" points for DC bias application device gates.

Capacitance 202 and inductance 302 also provide signal attenuation at the input of main amplifier stage 104, and capacitance 306 and inductance 308 provide signal attenuation at the input of peak amplifier stage 108, which allows a proper input power division between inputs of main and peak amplifier stages 104 and 108 when inductance 304 of input power splitter 320 is coupled between nodes 102 and 312. In this manner, a capacitive input impedance of both amplifier stages 104 and 108 is arranged, representing an input phase shifter of a low-pass filter (C-L-C) configuration by combining input pre-matching networks 314 and 316 with inductance 304. The 90 degree phase shift is implemented between the inputs of main and peak amplifier stages 104 and 108, such as a difference of 0° and 90°, or a difference of −45° and +45°, or other difference of phase angle that results in a phase shift of 90 degrees between inputs (e.g., gates) and outputs (e.g., drains, collectors) of the active devices. The phase difference between the signals at the input nodes of the main and peak amplifier stages 104 and 108 is weakly independent of the frequency over the frequency band of interest, maintaining a total phase variation (e.g., 70 to 110 degrees) over the entire frequency band, which is within required tolerance for proper Doherty amplifier operation. It is noted that different inductance values of inductor 304 may be selected to easily change the phase shift between the main and peak amplifier stages 104 and 108, as further discussed below in connection with FIG. 7.

The input power levels provided to the inputs of the main and peak amplifier stages 104 and 108 are dependent upon the gain of the main amplifier stage 104 and the gain of the peak amplifier stage 108. The gain of the peak amplifier stage 108 is typically less than the gain of the main amplifier stage 104 by some gain difference. The input power splitter provides a power level to the peak amplifier stage 108 that is greater than the power level provided to the main amplifier stage 104 in order to compensate for the gain difference and improve gain linearity of the Doherty amplifier device 300. The power level provided to the peak amplifier stage 108 is proportional to the gain difference. Stated another way, as the gain difference between the main and peak amplifier stages 104 and 108 increases, the power level provided to the peak amplifier stage 108 increases.

In order to divide the input power levels in a manner that corresponds to the gain of the main and peak amplifier stages 104 and 108, a resistive element 310 is coupled to node 312 of the input power splitter 320. A resistive value (or resistance) of resistive element 310 is selected based at least in part on the gain of the peak amplifier stage 108 compared with the gain of the main amplifier stage 104. Resistive element 310 implements a power division ratio that provides one power level to the input of main amplifier stage 104 and a greater power level to the input of peak amplifier stage 108 to compensate for the lower gain of the peak amplifier stage 108. Different resistive values of resistive element 130 may be used to effectively tune the gain linearity, as well as the efficiency, of the Doherty amplifier device 300, taking different operating parameters of the Doherty amplifier device 300 into account. Such tuning may be performed before runtime operation of the Doherty amplifier device 300 (e.g., on the mass production line before operation in a customer environment), or may be performed dynamically on-the-fly during runtime operation of the Doherty amplifier device 300 (e.g., in the customer environment, where resistive element 310 is removable and replaceable). The tuning can be based on one or more of the operating parameters that include but are not limited to the ratio of the gain of the peak amplifier stage 108 to the gain of the main amplifier stage 104, a present frequency of an input (RF carrier) signal received by the Doherty amplifier device, a present amplitude of the envelope modulation of the input (RF carrier) signal, a present operating power level of the Doherty amplifier device, and any combination thereof. In some embodiments, the resistive value can be adjusted quickly (e.g., resistive element 310 has variable resistance) by a controller based on the operating parameters of the Doherty amplifier device 300, such as for the gain ratio between peak and main amplifier stages, for different input signal frequencies, different envelope amplitudes, different operating power levels, and any combination thereof. Examples of resistive element 310 are further discussed below in connection with FIG. 4-6.

Regarding the termination of the input power splitter by resistive element 310 of any configuration, as at FIGS. 4a, 4b, 5a, 5b, 5c, and 6, it is noted that "controlling power division between amplifiers" when mentioned in the text should be understood also as "controlling phase difference between signals at inputs of two amplifiers" depending on the frequency of operation, in order to affect and equalize group delay of the two amplifiers of the Doherty amplifier device at any given operational frequency band. It should be understood that capacitive components, inductive components, or both, which may be connected in parallel or in series with the terminating resistive element 310 at port 312, will change phase shift of the signal at port 312 (or input of the peak amplifier) and will change group delay of the peak amplifier against that of the main amplifier, targeting their equality.

The dimensions (e.g., inductance values and capacitance values) of components of input pre-matching networks 314 and 316 are achieved by proper selection with respect to the operational frequency band(s) of the Doherty amplifier device 300. In some embodiments, input pre-matching networks 314 and 316 include an identical arrangement of components. In some embodiments, each component in one pre-matching network has an associated dimension (e.g., inductance value or capacitance value) that is identical to its counterpart component in the other pre-matching network. It is also noted that in an inverted Doherty amplifier arrangement, the main amplifier stage may be switched with the peak amplifier stage, resulting in an input of the switched main amplifier stage (e.g., at the location of element 108) being coupled to node 312 and an input of the switched peak amplifier stage (e.g., at the location of element 104) being coupled to node 102.

Semiconductor die 318 is attached to an underlying carrier substrate, such as a printed circuit board (PCB) that includes electrically conductive features on a non-conductive substrate, and may be formed using polyimide or FR4 or BT resin. In some embodiments, input power splitter 320 and output combining network 236 are implemented on the carrier substrate itself (e.g., as another integrated circuit). In other embodiments, input power splitter 320 is implemented on another semiconductor die that is attached to the carrier substrate, and output combining network 236 is implemented on another semiconductor die that is attached to the carrier substrate.

Examples of a semiconductor die, like semiconductor die 318, can be any semiconductor material or combinations of materials, such as gallium arsenide, silicon germanium, silicon-on-insulator (SOI), silicon, monocrystalline silicon, the like, and combinations of the above. The integrated circuitry on the semiconductor die is formed using a sequence of numerous process steps applied to the semiconductor die (e.g., in wafer form), including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. The integrated circuitry on the semiconductor die implements an integrated circuit (such as the integrated circuit on die 318 including amplifier stages 104 and 108 and pre-matching networks 314 and 316), where example components of integrated circuitry include but are not limited to dielectric materials with conductive structures, pads, interconnects, analog circuitry, digital logic, standalone discrete devices such as resistors, inductors, capacitors, diodes, power transistors, the like, and combinations thereof.

Figure 11B:
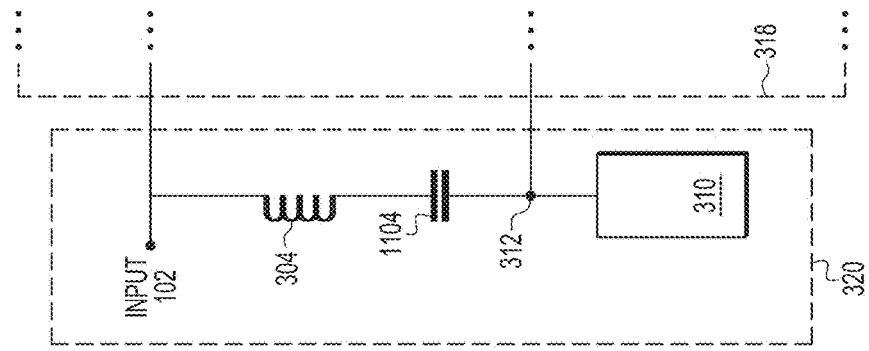
FIGS. 11A and 11B illustrate circuit diagrams depicting example alternative embodiments of the adjustable input power splitter circuit for use with the Doherty amplifier device of FIG. 3, according to some embodiments.
Figure 11A:
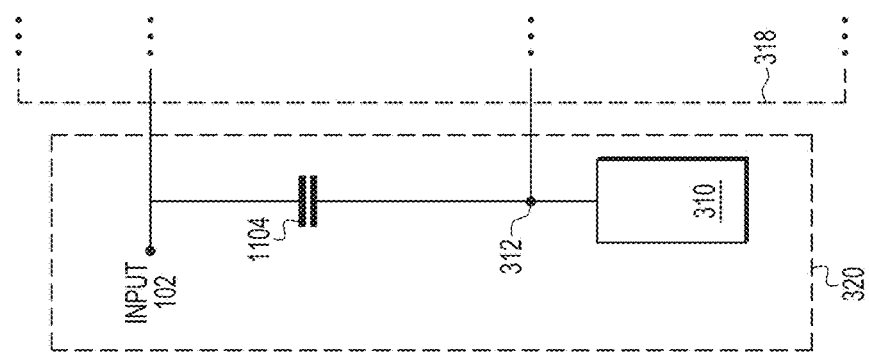

FIG. 11A illustrates another embodiment of input power splitter 320 that includes a capacitance 1104, rather than inductance 304, coupled between nodes 102 and 312. FIG. 11B illustrates another embodiment of input power splitter that includes both inductance 304 and capacitance 1104 coupled in series between nodes 102 and 312.

When using a capacitance 1104 of the same reactive impedance value (instead of an inductive one) as a phase shift element between main and peak amplifier inputs, input impedance Zin of the main and peak amplifiers should exhibit respective imaginary parts having the same magnitude but with an opposite sign (e.g., exhibits Zin=1+j*1, rather than Zin=1−j*1), which should be clear to those experienced in RF design. If capacitance 1104 is implemented as a voltage-controlled variable capacitance element (like the voltage controlled reverse biased diode discussed below in connection with FIGS. 5A and 5C), a similar fast phase shift correction may be applied between the inputs of main and peak amplifiers by application of correction bias voltage to the diode according to the operational frequency, input power level, envelope modulation signal amplitude, or any combination thereof, which allows optimal linearity while correcting efficiency of a Doherty amplifier device in real time.

FIG. 4A illustrates an embodiment of resistive element 310 that includes a resistor 402 having a resistive value (or a resistance) that can be selected to adjust the required power difference delivered to peak amplifier stage 108 as compared with the power delivered to main amplifier stage 104. It can be demonstrated by general transmission line theory that if resistive value of resistor 402 is larger than characteristic impedance Zo of the input C-L-C low-pass 90 degree phase shifter, then this slight mismatch will generate an RF signal voltage magnitude at the input of the peak device that is larger than the signal at the input of the main device, thus compensating the gain difference between the main and peak devices. An optimal resistive value of resistor 402 may be determined based in part on operating parameters of the Doherty amplifier device, such as the gain ratio between peak and main amplifier stages, a frequency of a presently received input signal, an envelope amplitude of the presently received input signal, an operating power level of the Doherty amplifier device, and any combination thereof. The optimal resistive value of resistor 402 provides optimal gain linearity, which may be balanced against optimal efficiency, of the Doherty amplifier device for any given power level, any given input signal frequency, and any given envelope amplitude. The gain difference control provided by resistor 402 can be used at any power level and at any frequency of the band and at the same time instantly, because all reactive component values are small and have a very low time constant that is much smaller than the period of the envelope modulation signal. In some embodiments, resistor 402 is connected to the input node 312 of the second amplifier stage by an external terminal on the carrier substrate, where resistor 402 is removable and replaceable. For example, resistor 402 may be coupled to one or more sockets or pads or other external terminals located on the carrier substrate for providing external connections. In the embodiment shown, resistor 402 is coupled between node 312 and ground or a similar reference supply voltage. A resistor with a constant optimal resistive value may be selected from among a number of resistors each having different constant resistive values and placed in the input power splitter 320 on the carrier substrate, in order to dynamically tune the gain linearity of the Doherty amplifier device by adjusting the power delivered to the peak amplifier stage 108 in an on-the-fly manner. In some embodiments, the resistor is selected and installed once to tune the Doherty amplifier device on the production line before use in a customer environment (e.g., a single fixed constant external resistor 402). In other embodiments, the resistor may be replaced during runtime operation of the Doherty amplifier device (e.g., in the customer environment). In other embodiments, a resistor with a variable resistive value can be adjusted to an optimal resistive value, as further discussed in connection with FIG. 6.

FIG. 4B illustrates another embodiment of resistive element 310 that includes resistor 402 coupled between node 312 and a gate bias network 404, which is configured to deliver a gate bias to the input of peak amplifier stage 108 via node 312 to control operation of the peak amplifier stage 108. Gate bias network 404 is also located off of the semiconductor die 318. In various embodiments, the resistive value of resistor 402 is selected to tune gain linearity of the Doherty amplifier device, as discussed above in connection with FIG. 4A. In some embodiments, gate bias network 404 is connected to resistor 402 by an external connection on the carrier substrate.

FIG. 5A illustrates another embodiment of resistive element 310 that includes an RLC network with a capacitive element (C) connected in series with an inductive element (L), where the capacitive element (C) may be either a capacitor having a constant capacitance or a voltage controlled reverse biased diode having a variable capacitance, where the junction capacitance of the diode may be changed by an external driving DC voltage (e.g., shown in FIG. 5C). For example, one terminal of a capacitance 502 (which may be either a capacitor or a voltage controlled reverse biased diode) is connected to node 312 and another terminal of capacitance 502 is connected to a terminal of an inductance 504. Another terminal of inductance 504 is connected to node 508, which is also connected to a terminal of resistor (R) 506. Capacitance 502, inductance 504, and resistor 506 are located off of the semiconductor die 318. In some embodiments, capacitance 502 and inductance 504 are located on the carrier substrate, and node 508 provides an external connection to resistor 506. In some embodiments, resistor 506 has a constant resistive value and is selected to tune gain linearity of the Doherty amplifier device, as discussed above. In some embodiments, resistor 506 has another terminal connected to a ground plane or other reference supply voltage plane like that shown in FIG. 4A. In other embodiments, resistor 506 has another terminal connected to a gate bias network 404 like that shown in FIG. 4B. In some embodiments, capacitance 502 has a capacitive value based on the frequency of the input signal to implement phase shifting or compensate for phase error, where the capacitive value may be constant (and may also be removable and replaceable by any one of a plurality of capacitors having different capacitive values in a manner comparable to resistor 506) or variable (such as by using a voltage controlled reverse biased diode). Additionally, the value of capacitance 502, the value of inductance 504, or both, may be variable and controlled by an external controller to effectively compensate for phase error between inputs of main and peak stages to provide tuned in-phase power combined at the Doherty output node at every frequency of the band and at every power level between average and peak power levels. In other embodiments, the value of resistor 506 may also be variable and controlled by an external controller, like that discussed below in connection with FIG. 6.

FIG. 5B illustrates another embodiment of resistive element 310 that includes an RLC network with a capacitive element connected in parallel with an inductive element. The capacitance value of C 502, inductance value of L 504, and resistive value or R 508 may be constant or variable, as discussed in connection with FIG. 5A. As illustrated, a first terminal of capacitance 502 is connected to a first terminal of inductance 504, and a second terminal of capacitance 502 is connected to a second terminal of inductance 504. The first terminals of capacitance 502 and inductance 504 are connected to node 312, and the second terminals of capacitance 502 and inductance 504 are connected to node 508. In some embodiments, node 508 provides an external connection to resistor 506, which has a resistive value that is selected to tune gain linearity of the Doherty amplifier device, as discussed above. In some embodiments, resistor 506 has another terminal connected to a ground plane or other reference supply voltage plane like that shown in FIG. 4A. In other embodiments, resistor 506 has another terminal connected to a gate bias network 404 like that shown in FIG. 4B.

FIG. 5C illustrates another embodiment of resistive element 310 that includes an inductive element (L) and capacitive element (C) implemented as a voltage controlled reverse biased diode 510, where the junction capacitance of the diode may be changed or varied by an external driving DC voltage Vcontrol. The junction capacitance may be changed based on the frequency of the input signal. For example, a first terminal of voltage controlled reverse biased diode 510 is connected to both node 312 and to a terminal of an inductance 504. Another terminal of inductance 504 is connected to Vcontrol, which may be provided by an external controller. In some embodiments, diode 510 and inductance 504 are located off of the semiconductor die 318. In other embodiments, diode 510 and inductance 504 are located on the carrier substrate. In some embodiments, the second terminal of diode 510 provides an external connection to a resistor, which has a resistive value that is selected to tune gain linearity of the Doherty amplifier device, as discussed above. In some embodiments, the second terminal of diode 510 is connected to a ground plane or other reference supply voltage plane like that shown in FIG. 4A. In other embodiments, a resistor may have a terminal connected to a gate bias network 404 like that shown in FIG. 4B. Diode 510 may be utilized in place of capacitors 502 in FIGS. 5A and 5B to provide adjustable capacitance. Additionally, the value of the capacitance of diode 510, the value of inductance 504, or both, may be controlled by an external controller (e.g., like controller 604 shown in FIG. 6) to effectively compensate for phase error between inputs of main and peak stages to provide tuned in-phase power combined at the Doherty output node at every frequency of the band and at every power level between average and peak power levels. In such an embodiment, the external controller is configured to adjust the junction capacitance of the diode based on one or more present operating parameters of the Doherty amplifier device, such as a present frequency of the input signal, a present envelope amplitude of the input signal, or a present operating power level of the Doherty amplifier. The external controller may be configured to search for the one or more present operating parameters in a look-up table, which may be the look-up table (LUT) 606 that is discussed below in connection with FIG. 6, or may be a separate look-up table. The external controller then adjusts the junction capacitance to a target optimal capacitance listed in the look-up table with the present frequency. The present operating parameters may be determined at a time when the Doherty amplifier device is on the production line before use in a customer environment, or may be determined on-the-fly during runtime operation of the Doherty amplifier device (e.g., in the customer environment).

FIG. 6 illustrates another embodiment of resistive element 310 that includes a variable resistor 602 having a varying resistance that is adjustable by a controller 604 to provide dynamic power distribution control. Controller 604 is connected to a control terminal of the variable resistor 602 and is configured to adjust the resistive value of the variable resistor 602 to an optimal resistive value, such as by altering a voltage or current supplied to the control terminal of variable resistor 602. Variable resistor 602 and controller 604 are located off of the semiconductor die 318. In some embodiments, controller 604 may be part of tuning equipment used to tune the Doherty amplifier device while on the production line before use in a customer environment. In other embodiments, controller 604 may be part of tuning equipment used to tune the Doherty amplifier device during runtime operation (e.g., in the customer environment), where the tuning equipment may be a separate device from the Doherty amplifier device or may be built into a semiconductor device that includes the Doherty amplifier device. One terminal of variable resistor 602 is connected to node 312. In some embodiments, variable resistor 602 has another terminal connected to a ground plane or other reference supply voltage plane like that shown in FIG. 4A. In other embodiments, variable resistor 602 has another terminal connected to a gate bias network 404 like that shown in FIG. 4B.

Controller 604 may be implemented using a microcontroller or microprocessor that is configured to store a look-up table (LUT) 606 in memory. The LUT 606 includes a number of table entries, where each entry includes one or more operating parameters 608, such as a particular frequency value of the input signal, and an associated resistance value 610. The resistance value 610 associated with each frequency value is an optimal resistance value that tunes the Doherty amplifier device 300 for optimal operation at that associated frequency value, and may be determined based on dimensions selected for the targeted runtime operation of Doherty amplifier device 300 and experimental data obtained during design time of the Doherty amplifier device 300 (i.e., before runtime operation of the Doherty amplifier device 300). In some embodiments, controller 604 is configured to determine the present frequency of the input signal received by Doherty amplifier device 300, while in other embodiments controller 604 is configured to consult a register or other buffer storage that includes an identifier of the present frequency as determined by another component of the Doherty amplifier device. The present operating parameters may be determined at a time when the Doherty amplifier device is on the production line before use in a customer environment (e.g., receiving a test input signal), or may be determined on-the-fly during runtime operation of the Doherty amplifier device (e.g., receiving an input signal in the customer environment).

Controller 604 is configured to search the LUT 606 for the present operating parameter (e.g., perform a look-up of the present frequency in the LUT). When a table entry including the present frequency is found, controller 604 is configured to use the resistance value included in the same table entry as the optimal resistive value for variable resistor 602, where the varying resistance of variable resistor 602 is adjusted to be within a tolerance window of the optimal resistive value. If an exact match is not present in the LUT 606, controller 604 may select an entry that has a closest match to the present frequency. In this manner, controller 604 can quickly make dynamic (or on-the-fly) adjustments of variable resistor 602 for a number of Doherty amplifier devices (such as on the production line) or for the Doherty amplifier device during runtime operation each time the frequency of the presently received input signal changes.

In other embodiments, the table entries of LUT 606 may also include additional operating parameters 608 for selecting an optimal resistive value. For example, each table entry may also include, either alternative to the input signal frequency or in addition to the input signal frequency, an indicator of the gain ratio between the required peak amplifier gain and the required main amplifier gain, an indicator of a present operating power level or state of the Doherty amplifier device 300, and an indicator of a present envelope amplitude (e.g., maximum overall amplitude) of the input signal. In an embodiment of LUT 606 that includes a plurality of gain ratios, the peak amplifier gain and the main amplifier gain may be minimally altered based on the bias points utilized for the peak and main amplifiers, which provides a plurality of different possible gain ratios. In an embodiment of LUT 606 that includes a plurality of operating power levels, controller 604 is configured to determine a present operating power level of the Doherty amplifier device 300, such as whether the device 300 is operating at a back-off power level (e.g., peak amplifier stage 108 is off), at a peak power level (e.g., main and peak amplifier stages 104 and 108 are receiving maximum power), or at an average power level between the back-off power level and the peak power level. Controller 604 may be configured to determine the present operating power level of the device 300 by determining a power level present at input node 102. In an embodiment of LUT 606 that includes a plurality of envelope amplitudes, controller 604 is configured to determine a present envelope amplitude of the input signal. Controller 604 then searches the LUT 606 for a table entry that includes one or more of the present frequency, the present operating power level, the present envelope amplitude, or any combination thereof, and uses the associated resistance value as a target optimal resistive value for variable resistor 602. If an exact match is not present in the LUT 606, controller 604 may select an entry that has closest matches to the combination of present frequency, present operating power level, and present envelope amplitude. In this manner, controller 604 can quickly make dynamic adjustments of variable resistor 602 each time the present operating frequency is changed, as well as each time the Doherty amplifier device 300 outputs at a different power level of operation, or each time the envelope amplitude of the input signal changes (which may be either on the production line or in a customer environment). Stated another way, controller 604 selects a resistance value that implements an optimal ratio of the second gain to the first gain for a given RF frequency of the input signal, for a given operating power level of the Doherty amplifier device, for a given envelope amplitude of the input signal, or any combination thereof.

Other examples of operating parameters used to tune the Doherty amplifier device include output mismatch parameters and environment temperature. If the load is mismatched (such as the case when the Doherty amplifier device is connected directly to the antenna), the Doherty amplifier will likely be mistuned. If output mismatch parameters are available (which may be obtained through a reflectometer connected between the Doherty amplifier device output and the antenna), the Doherty amplifier device can be further tuned by controlling the termination of the input power splitter in a similar manner. Similarly, if environment temperature variation is known, the Doherty amplifier device can be further tuned by compensating for the variation.

Figure 7:
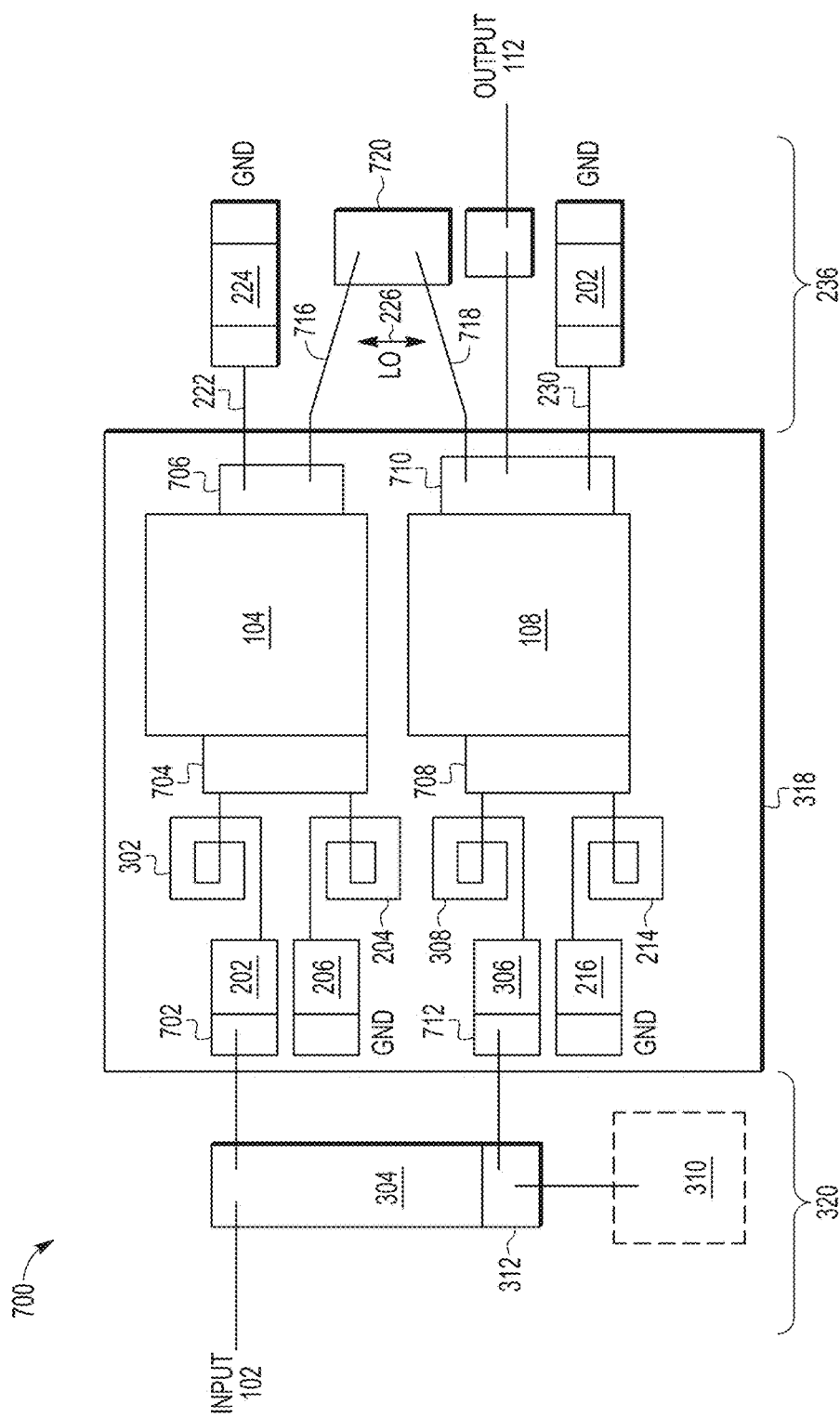
FIG. 7 illustrates a circuit layout depicting an example Doherty amplifier device that includes an adjustable input power splitter circuit in which the present disclosure is implemented, according to some embodiments.

FIG. 7 illustrates a circuit layout depicting an example Doherty amplifier device 700 that includes an adjustable input power splitter circuit 320. Semiconductor die 318 includes amplifier stages 104 and 108. Amplifier stage 104 has an input node 704 that is connected to a series connected inductance 204 and capacitance 206, where capacitance 206 has a terminal coupled to the ground plane or similar reference supply voltage plane. Input node 704 is also coupled to an external connection node 702 by a series connected inductance 302 and capacitance 202. Amplifier stage 108 has an input node 708 that is connected to a series connected inductance 214 and capacitance 216, where capacitance 216 has a terminal coupled to the ground plane or similar reference supply voltage plane. Input node 708 is also coupled to an external connection node 712 by a series connected inductance 308 and capacitance 306. Amplifier stage 104 also has an output node 706 and amplifier stage 108 has an output node 710, where output nodes 706 and 710 also serve as external connection nodes. It is noted that amplifier stages 104 and 108, inductances 302, 204, 308, 214 and capacitances 202, 206, 306, 216 are implemented as an integrated circuit (e.g., integrated into the silicon) of semiconductor die 318. In one embodiment, amplifier stage 104 is a main amplifier stage and amplifier stage 108 is a peak amplifier stage. It is noted that in an inverse Doherty amplifier arrangement, amplifier stage 104 is a peak amplifier stage and amplifier stage 108 is a main amplifier stage.

Input power splitter 320 is located off of the semiconductor die 318. It is noted that the area of the input power splitter 320 is small compared to the active device area of the semiconductor die 318. In some embodiments, input power splitter 320 is implemented on a carrier substrate to which the semiconductor die 318 is attached. In other embodiments, input power splitter 320 may be integrated on another semiconductor die also attached to the carrier substrate. External connection node 702 on semiconductor is connected to an input node 102 of input power splitter 320, and external connection node 712 is connected to an intermediate node 312 of input power splitter 320. External connection nodes 702 and 712 may be connected to nodes 102 and 312 by bond wires. Inductance 304 is connected between nodes 102 and 312. In one embodiment, inductance 304 is implemented by a length of transmission line that has the required inductance value. In other embodiments, inductance 304 is implemented by one or more bond wires that have the required inductance value. In still other embodiments, inductance 304 may be integrated into silicon of the carrier substrate or on another semiconductor die that is attached to the carrier substrate. Since inductance 304 is located off of the semiconductor die 318, inductance 304 may be removable and replaceable similar to resistive element 310 to aid in tuning input impedance, phase shift between main and peak amplifier stages, or other characteristics of the Doherty amplifier device 700 (e.g., nodes 102 and 312 serve as sockets, pad, terminals, or other structures providing external connections to inductance 304, which can be replaced with inductors or transmission lines having different inductance values).

Resistive element 310 has a terminal connected to node 312. In some embodiments, node 312 serves as a socket, pad, terminal or other structure providing an external connection to resistive element 310. Resistive element 310 includes one of the embodiments discussed above in connection with FIG. 4-6.

Output combining network 236 is also located off of the semiconductor die 318. In some embodiments, output combining network 236 is implemented on the carrier substrate to which the semiconductor die 318 is attached. In other embodiments, output combining network 236 is integrated on another semiconductor die also attached to the carrier substrate. External connection node 706 of amplifier stage 104 is connected to capacitance 224 of output combining network 236, where capacitance 224 has a terminal coupled to the ground plane or similar reference supply voltage plane, and external connection node 710 of amplifier stage is connected to capacitance 232, where capacitance 232 has a terminal coupled to the ground plane or similar reference supply voltage plane. External connection nodes 706 and 710 may be connected to capacitances 224 and 232 by bond wires. An inductance 226 is also connected between external connection nodes 706 and 710. In some embodiments, inductance 226 is implemented by one or more bond wires that have the required inductance value, such as bond wires 716 and 718. As shown, bond wires 716 and 718 connect node 706 and 710 to a node 720 (e.g., a pad or terminal providing an external connection) off of the semiconductor die 318, which may introduce some parasitic capacitance that should be taken into consideration when designing output combining network 236. In other embodiments, inductance 226 may be integrated in the silicon of the carrier substrate or on another semiconductor die that is attached to the carrier substrate. An output node 112 is also connected to the output node 710 of amplifier stage 108.

Example S-parameter simulation results of the present Doherty amplifier device 300 are illustrated in FIG. 8A-8F. The S-parameter simulations are performed for an operating frequency bandwidth of the Doherty amplifier device 300 that spans a range from 2 to 3 GHz (which covers the bandwidth for mobile communication), while also varying the resistive value of resistive element 310 in the input power splitter 320 from 30 to 90 Ohms.

Figure 8A:
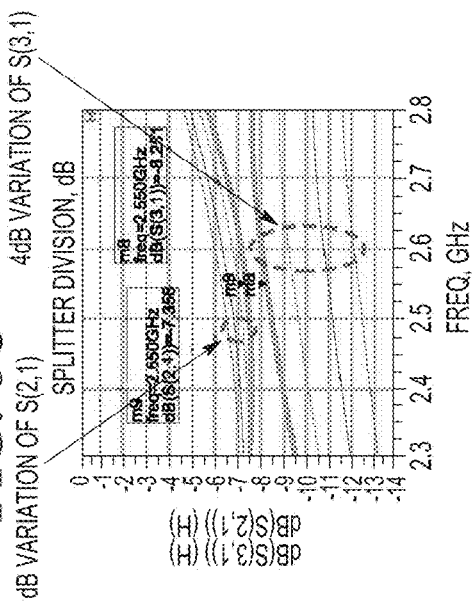

FIG. 8A illustrates a Smith chart showing the input impedance of the Doherty amplifier device 300 over the operational frequency bandwidth, each impedance curve being associated with a different resistive value. As one example, input impedance changes from marker m1 to marker m3 as frequency is increased from 2.5 to 2.7 GHz. Input impedance is shown near the center of the Smith chart and is close to 50 ohms. It is noted that the input impedance of the Doherty amplifier device 300 has little variation as the resistive value of resistive element 310 is changed. In other words, the input impedance of the Doherty amplifier device 300 is well matched and stable while the input power splitter adjusts the power division between the main and peak amplifier stages.

Figure 8B:
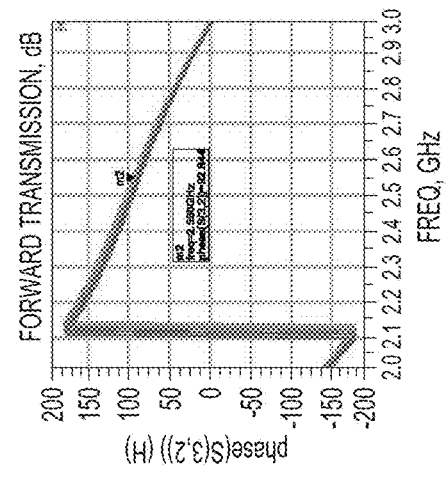

FIG. 8B illustrates phase characteristics of the Doherty amplifier device over the operational frequency bandwidth, each curve associated with a different resistive value. As shown, the phase characteristics are generally linear and show little variation as the resistive value of resistive element 310 is changed. In other words, the phase characteristics of the Doherty amplifier device 300 are linear and stable while the input power splitter adjusts the power division between the main and peak amplifier stages.

Figure 8C:
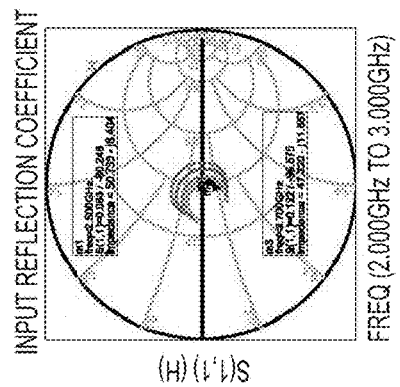

FIG. 8C illustrates the power division produced by the input power splitter as power distribution curves to the main and peak amplifier stages over the operational frequency bandwidth, each pair of curves associated with a different resistive value. The curves show that the difference between the power levels delivered to the main and peak amplifier stages can be adjusted from roughly 1 dB shown by bold lines (e.g., −7.3 at m9 and −8.3 at m8) to around 6 dB (e.g., −6.5 dB versus 12.25 dB at central frequency 2.5 GHz), by adjusting the resistive value of resistive element 310. Accordingly, input power splitter provides a wide range for varying the power division between the main and peak amplifier stages over the entire range of the operational frequency bandwidth. It is also noted that the power distribution of the input power splitter tends to increase with frequency, providing more power to the inputs of the main and peak amplifier stages. As such, this increasing trend compensates for the natural loss of gain (or so called "gain roll-off") of the active devices and Doherty amplifier stages that occurs as frequency increases, due to device characteristics of the amplifier stages.

Figure 8D:
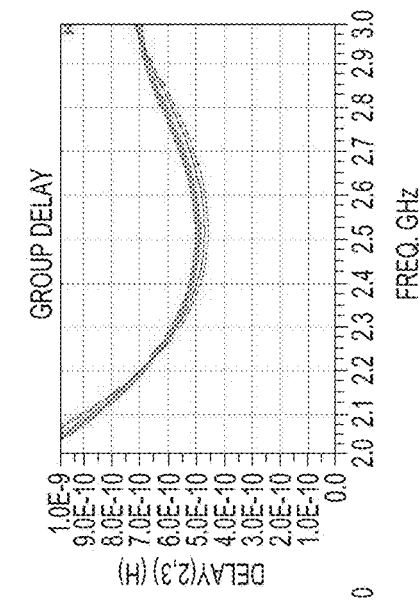

FIG. 8D illustrates a Smith chart showing output impedance of the Doherty amplifier device over the operation frequency bandwidth, each curve associated with a different resistive value. The respective input impedance curves, each similarly associated with the different resistive value, are also illustrated in FIG. 8D. For example, the output impedance changes from marker m4 to marker m5 as the frequency increases from 2.5 GHz to 2.7 GHz. On another curve, the output impedance changes from m12 to m13 as frequency increases from 2.5 GHz to 2.7 GHz. It is noted that the output impedance of the Doherty amplifier device 300 has little variation as the resistive value of resistive element 310 is changed. In other words, the output impedance of the Doherty amplifier device 300 is stable while the input power splitter adjusts the power division between the main and peak amplifier stages.

Figure 8E:
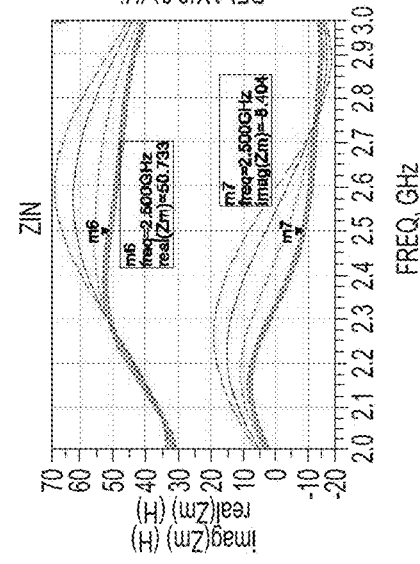

FIG. 8E illustrates a rectangular coordinate graph showing input impedance Zin of the Doherty amplifier device 300, where the top set of curves illustrate a real part of the input impedance Zin and the bottom set of curves illustrate an imaginary part of the input impedance Zin. Each pair of curves are associated with a different resistive value. As shown, the input impedance Zin is generally flat over the operational frequency bandwidth of the Doherty amplifier device, covering the full band from 2 to 3 GHz and providing wideband operation. It is noted that the components of input impedance Zin of the Doherty amplifier device 300 has little variation as the resistive value of resistive element 310 is changed.

Figure 8F:
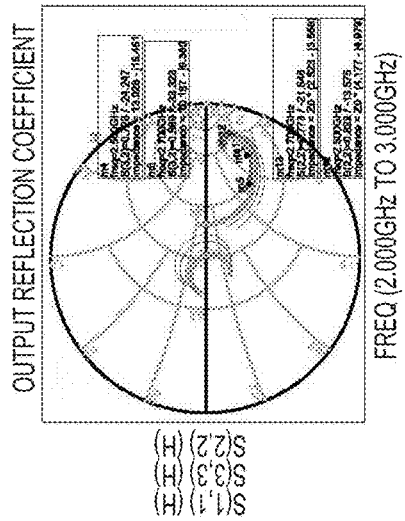

FIG. 8F illustrates group delay, or time delay of the input signal between the inputs of main and peak amplifier stages of the Doherty amplifier device, each curve associated with a different resistive value. It is noted that the group delay over the operational frequency bandwidth is relatively small and has little variation as the resistive value of resistive element 310 is changed. In the example shown, the group delay is close to a half nanosecond at central frequency 2.5 GHz of the band with minimal deviations over the frequency band, the value of which is close to the group delay introduced by output combiner network. This allows minimal variation of AM-PM shape over the frequency band, or AM-PM dispersion and best conditions for effective output power combination over the entire operational frequency band. The variation of the group delay of the input signal between the main and peak amplifier stages is generally flat over the operational frequency bandwidth, which has a minimum effect on the shape and value of the input signal and provides wideband operation. In other words, the group delay of the Doherty amplifier device 300 is stable while the input power splitter adjusts the power division between the main and peak amplifier stages.

Example simulation results of the present Doherty amplifier device 300 are illustrated in FIG. 9A-9D. The simulations are performed for an example operating frequency at 2.6 GHz, each simulation run for a different resistive value of the resistive element 310. In the simulations illustrated, each curve is associated with a different resistive value, which include 40 ohms, 60 ohms, 80 ohms, and 90 ohms.

FIG. 9A illustrates a rectangular coordinate chart showing the gain of the Doherty amplifier device 300. Generally, the gain curves show that as gain decreases, power Pout increases. However, the effect of the power division variation (or changing the resistive value of resistive element 310) is illustrated within the circle having a broken outline. The rate at which power Pout increases is controlled by the resistive value selected, where linearity of the gain (also known as AM-AM characteristic) can be altered or tuned based on the resistive value selected.

FIG. 9B illustrates a rectangular coordinate chart showing input return loss (IRL) of the present Doherty amplifier device 300, where the IRL curves remain generally flat as power Pout increases. The IRL curves also show very little variation as the resistive value changes. In other words, IRL remains stable while the input power splitter adjusts the power division between the main and peak amplifier stages.

FIG. 9C illustrates a rectangular coordinate chart showing efficiency of the present Doherty amplifier device 300 versus output power level. Generally, the efficiency curves show that as power Pout increases, the efficiency increases. The effect of the power division variation is illustrated within the circle having a broken outline. The rate at which efficiency increases at around average power level is controlled by the resistive value, where linearity versus efficiency can be altered or tuned based on the resistive value selected. It is noted that FIGS. 9A and 9C (and also 9D) illustrate a tradeoff between optimal efficiency and optimal gain and phase linearity, where a best operation of the Doherty amplifier device 300 that balances efficiency and gain linearity can be achieved by changing the resistive value.

FIG. 9D illustrates a rectangular coordinate chart showing AM-PM characteristics, shown as unwrapped phase over power Pout, of the present Doherty amplifier device 300. The effect of the power division variation is illustrated within the circle having a broken outline. The linearity of the AM-PM characteristic can be altered or tuned based on the resistive value selected. In cases where error correction is enabled by an additional capacitance and inductance in parallel or in series with resistive termination as shown in FIGS. 5A and 5B, the AM-PM characteristic shape and amplitude can be further improved. It is noted that bold lines represent extreme tuning for maximum efficiency at the expense of linearity, where AM-AM and AM-PM characteristics are most non-linear.

Example simulation results of the present Doherty amplifier device 300 are illustrated in FIG. 10A-10D. The simulations are performed for an optimal resistive value of resistive element 310 only at different operating frequencies from 2.5 GHz to 2.7 GHz, each simulation run for a different operating frequency. In the simulations illustrated, each curve is associated with a different operating frequency, which include 2.5 GHz, 2.6 GHz, and 2.7 GHz. It is noted that the resistive value of the resistive element 310 can be quickly adjusted to the optimal resistive value by external controller 604 based on the specific operating frequency of the Doherty amplifier device 300, in order to provide optimum tuning. Further improvement of operation may be achieved if capacitive and inductive components are also involved in parallel or in series with resistive element 310, depending on desired frequency band fraction and desired power dependent characteristics to be optimized.

Figure 10B:
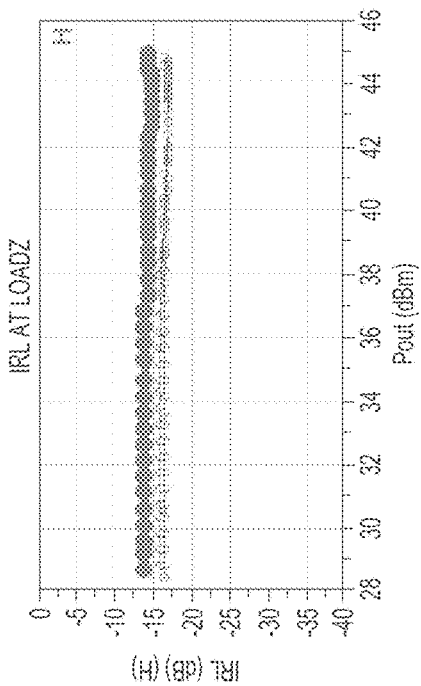
Figure 10D:
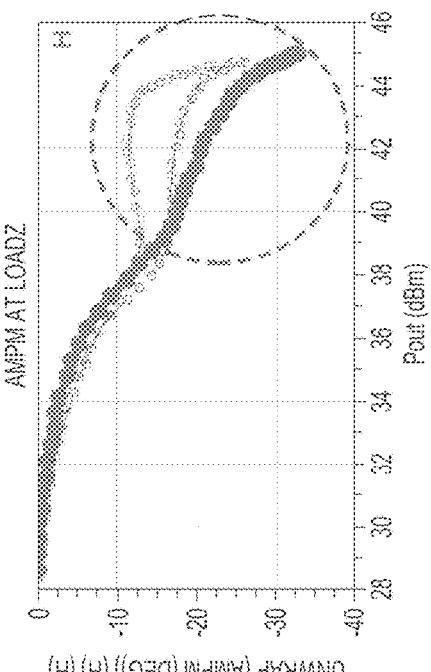
Figure 10A:
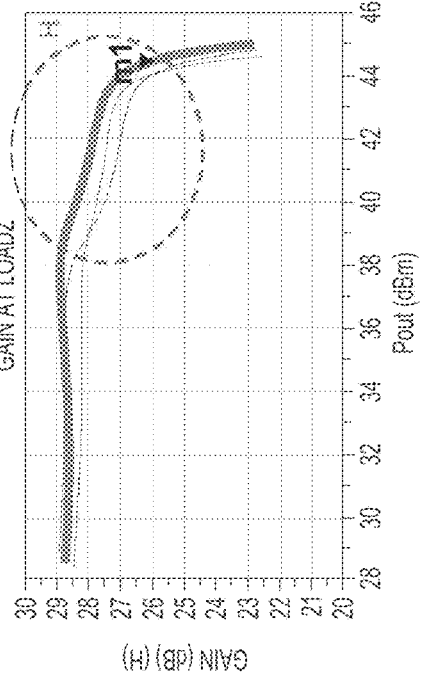

FIG. 10A illustrates a rectangular coordinate chart showing the gain of the Doherty amplifier device 300. The effect of the optimal resistive value is illustrated within the circle having a broken outline. The linearity of the gain is altered or tuned based on the optimal resistive value selected, and is relatively flat.

FIG. 10B illustrates a rectangular coordinate chart showing input return loss (IRL) of the present Doherty amplifier device 300, where the IRL curves remain generally stable and flat with little variation.

Figure 10C:
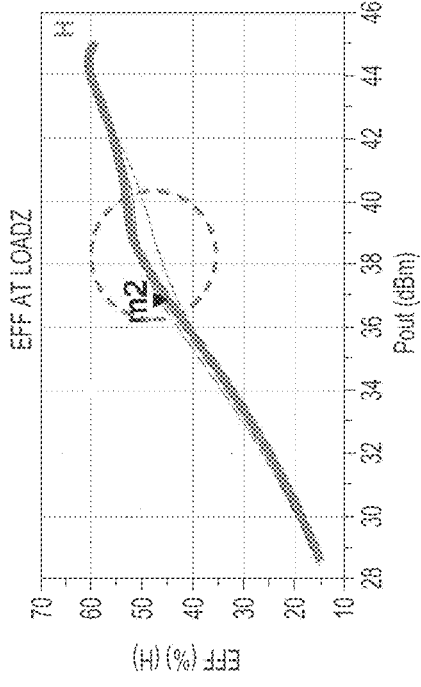

FIG. 10C illustrates a rectangular coordinate chart showing efficiency of the present Doherty amplifier device 300. The effect of the optimal resistive value is illustrated within the circle having a broken outline. The linearity of the efficiency can be altered or tuned based on the optimal resistive value selected, and is relatively flat. It is noted that FIGS. 10A and 10C illustrate a balanced approach to achieving good efficiency and gain linearity by changing the optimal resistive value based on the power level. In other words, one optimal resistive value can be selected to maintain a best efficiency during back-off power when the peak amplifier stage is not active, and another optimal resistive value can be selected to maintain a best gain linearity during peak power, while the resistive value can also be adjusted during average power to maintain both good gain linearity and efficiency.

FIG. 10D illustrates a rectangular coordinate chart showing AM-PM characteristics of the present Doherty amplifier device 300. The effect of the optimal resistive value is illustrated within the circle having a broken outline. The linearity of the AM-PM characteristic can be altered or tuned and further optimized based on the selected optimal resistive value, capacitive value, inductive value, or any combination thereof. It is noted that AM-PM changes by 10 degrees in the operational frequency bandwidth, which falls within tolerance levels, even with regulation using only resistive termination 310.

By now it should be appreciated that there has been provided a Doherty amplifier device that includes an adjustable input power splitter, which provides a quick and easy way to dynamically tune gain linearity of a Doherty amplifier device for best overall performance. The adjustable input power splitter includes a resistive element that has a resistive value selected based on the difference between the gain of the main amplifier device and the gain of the peak amplifier device. The resistive element implements a power division ratio that delivers additional power to the peak amplifier, which corresponds to the lower gain of the peak amplifier device, thereby tuning the gain linearity of the Doherty amplifier device.

In one embodiment of the present disclosure, a Doherty amplifier device is provided, the device including: a first amplifier stage having a first gain; a second amplifier stage having a second gain that is less than the first gain; and an input power splitter coupled to an input of the first amplifier stage and coupled to an input of the second amplifier stage, wherein the input power splitter includes either an inductive element, a capacitive element, or both coupled between the inputs of the first and second amplifier stages, and a resistive element coupled to the input of the second amplifier stage, the input power splitter is configured to deliver a first power level to the input of the first amplifier stage and a second power level to the input of the second amplifier stage, and the resistive element is configured to tune gain linearity of the Doherty amplifier device by increasing the second power level to be greater than the first power level, based at least in part on a ratio of the second gain to the first gain.

One aspect of the above embodiment provides that the resistive element includes a resistor having a resistive value selected for optimal gain linearity of the Doherty amplifier device, based at least in part on one or more operating parameters of the Doherty amplifier device that include: the ratio of the second gain to the first gain, a frequency of a presently received input signal, an envelope amplitude of the presently received input signal, and an operating power level of the Doherty amplifier device.

A further aspect of the above embodiment provides that the resistive element is connected to the input of the second amplifier stage by an external terminal located on a carrier substrate and the resistor is selected from one of a number of resistors having different resistive values configured to dynamically tune the gain linearity of the Doherty amplifier for different operating parameters.

Another further aspect of the above embodiment provides that the resistive element further includes a capacitive element and an inductive element connected either in parallel or in series, and the resistor is connected to at least the inductive element via an external terminal located on a carrier substrate.

A still further aspect of the above embodiment provides that a capacitive value of the capacitive element and an inductance value of the inductive element are controllable.

Another further aspect of the above embodiment provides that the resistive element includes a variable capacitor having an adjustable capacitive value that is controllable by an external control voltage, based on the frequency of the presently received input signal.

Another aspect of the above embodiment provides that the device further includes: a controller coupled to the resistive element, wherein the resistive element includes a variable resistor having an adjustable resistive value, and the controller is configured to control the adjustable resistive value to an optimal resistive value for the Doherty amplifier device, based at least in part on the ratio of the second gain to the first gain.

A further aspect of the above embodiment provides that the controller includes a look-up table, the look-up table includes a plurality of parameter sets, each parameter set associated with one of a plurality of resistive values, each parameter set includes one or more operating parameters of the Doherty amplifier device, the controller is configured to look up a present parameter set in the look-up table to select the optimal resistive value for the adjustable resistive value of the variable resistor.

A still further aspect of the above embodiment provides that the present parameter set includes one or more of: the ratio of the second gain to the first gain, a frequency of a presently received input signal, an envelope amplitude of the presently received input signal, and an operating power level of the Doherty amplifier device, and the controller is configured to look up the present parameter set in response to a change of any operating parameter included in the present parameter set.

Another aspect of the above embodiment provides that the device further includes: a first pre-matching network and a second pre-matching network respectively coupled between the inputs of the first and second amplifier stages and the input power splitter, wherein the first and second amplifier stages and the first and second pre-matching networks are integrated on a semiconductor die attached to a carrier substrate, and the input power splitter is located off of the semiconductor die.

In another embodiment of the present disclosure, an electronic circuit that includes a Doherty amplifier device is provided, the electronic circuit includes: an input power splitter having a first node coupled to an input of a main amplifier stage and a second node coupled to an input of a peak amplifier stage, the input power splitter configured to: provide a first signal having a first power level to the input of the main amplifier stage, and provide a second signal having a second power level to the peak amplifier stage, wherein the main amplifier stage has a first gain, the peak amplifier stage has a second gain that is less than the first gain, and the input power splitter includes either an inductive element, a capacitive element, or both coupled between the first and second nodes, and a resistive element coupled to the second node, wherein the resistive element is configured to adjust the second power level to be greater than the first power level in order to tune gain linearity of the Doherty amplifier device, based at least in part on a ratio of the second gain to the first gain.

One aspect of the above embodiment provides that the circuit further includes: a first pre-matching network coupled between the input power splitter and the input of the main amplifier stage, and a second pre-matching network coupled between the input power splitter and the input of the peak amplifier stage, wherein each of the first and second pre-matching networks include a first capacitance coupled in series with a first inductance between the input power splitter and the respective input of the main and peak amplifier stages, and a second inductance coupled in series with a second capacitance between the respective input of the main and peak amplifier stages and ground.

A further aspect of the above embodiment provides that the main and peak amplifier stages and the first and second pre-matching networks are integrated on a semiconductor die attached to a carrier substrate, and the input power splitter is located off of the semiconductor die.

Another aspect of the above embodiment provides that the resistive element includes one resistor selected from a plurality of resistors having a plurality of resistive values configured to dynamically tune the gain linearity of the Doherty amplifier device for different operating parameters, the one resistor selected based on a combination of present operating parameters of the Doherty amplifier device that include one or more of: the ratio of the second gain to the first gain, a frequency of a presently received input signal, an envelope amplitude of the presently received input signal, and an operating power level of the Doherty amplifier device.

A further aspect of the above embodiment provides that the resistive element further includes a capacitive element and an inductive element connected either in parallel or in series, the one resistor is connected to at least the inductive element, and a capacitance value of the capacitive element and an inductance value of the inductive element are controllable.

Another aspect of the above embodiment provides that the resistive element includes a voltage-controlled variable capacitive element having an adjustable capacitive value based on a frequency of a presently received input signal, the adjustable capacitive value is controllable.

Another aspect of the above embodiment provides that the resistive element includes a variable resistor having an adjustable resistive value that is controllable to an optimal resistive value, the optimal resistive value is selected based on a combination of present operating parameters of the Doherty amplifier device that include one or more of: the ratio of the second gain to the first gain, a frequency of a presently received input signal, an envelope amplitude of the presently received input signal, and an operating power level of the Doherty amplifier device.

In another embodiment of the present disclosure, a method for operating a Doherty amplifier device is provided, the method including: receiving an input signal at an input power splitter, wherein the input power splitter is coupled to a main amplifier stage and a peak amplifier stage of the Doherty amplifier device, the main amplifier stage having a first gain and the peak amplifier stage having a second gain less than the first gain; dynamically adjusting a first power level and a second power level of the Doherty amplifier device based on a power division ratio implemented by a resistive element of the input power splitter, wherein the power division ratio corresponds at least in part to a ratio of the second gain to the first gain; and delivering the first power level to an input of the main amplifier stage and the second power level to an input of the peak amplifier stage, wherein the second power level is adjusted to be greater than the first power level to tune gain linearity of the Doherty amplifier device.

One aspect of the above embodiment provides that the dynamically adjusting the first and second power levels includes: determining one or more parameters from a group including: the ratio of the second gain to the first gain, a present frequency of a presently received input signal, a present envelope amplitude of the presently received input signal, and a present operating power level of the Doherty amplifier device, searching a look-up table for the one or more parameters, identifying an optimal resistive value associated with the one or more parameters in the look-up table, and controlling an adjustable resistive value of the resistive element to the optimal resistive value.

A further aspect of the above embodiment provides that the dynamically adjusting the first and second power levels further includes: identifying an optimal capacitance value also associated with the one or more parameters, wherein the resistive element further includes a variable capacitance element, and controlling an adjustable capacitance value of the variable capacitance element to the optimal capacitance value.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose. Also as used herein, the terms "approximately" and "about" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. For example, additional or fewer capacitive inductive components may be implemented in the input power input splitter of FIG. 3. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A Doherty amplifier device comprising:
   a first amplifier stage having a first gain;
   a second amplifier stage having a second gain that is less than the first gain; and
   an input power splitter coupled to an input of the first amplifier stage and coupled to an input of the second amplifier stage, wherein
      the input power splitter comprises either an inductive element, a capacitive element, or both coupled in series between the inputs of the first and second amplifier stages, and a resistive element coupled between the input of the second amplifier stage and ground, the input power splitter is configured to deliver a first power level to the input of the first amplifier stage and a second power level to the input of the second amplifier stage, and the resistive element is configured to tune gain linearity of the Doherty amplifier device by increasing the second power level to be greater than the first power level, based at least in part on a ratio of the second gain to the first gain.

2. The device of claim 1, wherein the resistive element comprises a resistor having a resistive value selected for optimal gain linearity of the Doherty amplifier device, based at least in part on one or more operating parameters of the Doherty amplifier device that include: the ratio of the second gain to the first gain, a frequency of a presently received input signal, an envelope amplitude of the presently received input signal, and an operating power level of the Doherty amplifier device.

3. The device of claim 2, wherein the resistive element is connected to the input of the second amplifier stage by an external terminal located on a carrier substrate and the resistor is selected from one of a number of resistors having different resistive values configured to dynamically tune the gain linearity of the Doherty amplifier for different operating parameters.

4. The device of claim 2, wherein the resistive element further comprises a capacitive element and an inductive element connected either in parallel or in series, and the resistor is connected to at least the inductive element via an external terminal located on a carrier substrate.

5. The device of claim 4, wherein a capacitive value of the capacitive element and an inductance value of the inductive element are controllable.

6. The device of claim 2, wherein the resistive element comprises a variable capacitor having an adjustable capacitive value that is controllable by an external control voltage, based on the frequency of the presently received input signal.

7. The device of claim 1, further comprising:
a controller coupled to the resistive element, wherein
the resistive element comprises a variable resistor having an adjustable resistive value, and
the controller is configured to control the adjustable resistive value to an optimal resistive value for the Doherty amplifier device, based at least in part on the ratio of the second gain to the first gain.

8. The device of claim 7, wherein
the controller comprises a look-up table,
the look-up table comprises a plurality of parameter sets, each parameter set associated with one of a plurality of resistive values, each parameter set includes one or more operating parameters of the Doherty amplifier device,
the controller is configured to look up a present parameter set in the look-up table to select the optimal resistive value for the adjustable resistive value of the variable resistor.

9. The device of claim 8, wherein
the present parameter set includes one or more of: the ratio of the second gain to the first gain, a frequency of a presently received input signal, an envelope amplitude of the presently received input signal, and an operating power level of the Doherty amplifier device, and
the controller is configured to look up the present parameter set in response to a change of any operating parameter included in the present parameter set.

10. The device of claim 1, further comprising:
a first pre-matching network and a second pre-matching network respectively coupled between the inputs of the first and second amplifier stages and the input power splitter, wherein
the first and second amplifier stages and the first and second pre-matching networks are integrated on a semiconductor die attached to a carrier substrate, and
the input power splitter is located off of the semiconductor die.

11. An electronic circuit comprising a Doherty amplifier device, the electronic circuit comprises:
an input power splitter having a first node coupled to an input of a main amplifier stage and a second node coupled to an input of a peak amplifier stage, the input power splitter configured to:
provide a first signal having a first power level to the input of the main amplifier stage, and
provide a second signal having a second power level to the peak amplifier stage, wherein
the main amplifier stage has a first gain, the peak amplifier stage has a second gain that is less than the first gain, and
the input power splitter comprises either an inductive element, a capacitive element, or both coupled in series between the first and second nodes, and a resistive element coupled between the second node and ground, wherein the resistive element is configured to adjust the second power level to be greater than the first power level in order to tune gain linearity of the Doherty amplifier device, based at least in part on a ratio of the second gain to the first gain.

12. The circuit of claim 11, further comprising:
a first pre-matching network coupled between the input power splitter and the input of the main amplifier stage, and
a second pre-matching network coupled between the input power splitter and the input of the peak amplifier stage, wherein
each of the first and second pre-matching networks comprise a first capacitance coupled in series with a first inductance between the input power splitter and the respective input of the main and peak amplifier stages, and a second inductance coupled in series with a second capacitance between the respective input of the main and peak amplifier stages and ground.

13. The circuit of claim 12, wherein
the main and peak amplifier stages and the first and second pre-matching networks are integrated on a semiconductor die attached to a carrier substrate, and
the input power splitter is located off of the semiconductor die.

14. The circuit of claim 11, wherein the resistive element comprises one resistor selected from a plurality of resistors having a plurality of resistive values configured to dynamically tune the gain linearity of the Doherty amplifier device for different operating parameters, the one resistor selected based on a combination of present operating parameters of the Doherty amplifier device that include one or more of: the ratio of the second gain to the first gain, a frequency of a presently received input signal, an envelope amplitude of the presently received input signal, and an operating power level of the Doherty amplifier device.

15. The circuit of claim 14, wherein the resistive element further comprises a capacitive element and an inductive element connected either in parallel or in series, the one resistor is connected to at least the inductive element, and a capacitance value of the capacitive element and an inductance value of the inductive element are controllable.

16. The circuit of claim 11, wherein the resistive element comprises a voltage-controlled variable capacitive element having an adjustable capacitive value based on a frequency of a presently received input signal, the adjustable capacitive value is controllable.

17. The circuit of claim 11, wherein the resistive element comprises a variable resistor having an adjustable resistive value that is controllable to an optimal resistive value, the optimal resistive value is selected based on a combination of present operating parameters of the Doherty amplifier device that include one or more of: the ratio of the second gain to the first gain, a frequency of a presently received input signal, an envelope amplitude of the presently received input signal, and an operating power level of the Doherty amplifier device.

18. A method for operating a Doherty amplifier device, the method comprising:
receiving an input signal at an input power splitter, wherein the input power splitter is coupled to a main amplifier stage and a peak amplifier stage of the Doherty amplifier device, the main amplifier stage having a first gain and the peak amplifier stage having a second gain less than the first gain;
dynamically adjusting a first power level and a second power level of the Doherty amplifier device based on a power division ratio implemented by a resistive element of the input power splitter, wherein the input power splitter comprises either an inductive element, a capacitive element, or both coupled in series between an input of the main amplifier stage and an input of the peak amplifier stage, wherein the resistive element is coupled between the input of the peak amplifier stage and ground, and wherein the power division ratio corresponds at least in part to a ratio of the second gain to the first gain; and
delivering the first power level to an input of the main amplifier stage and the second power level to an input of the peak amplifier stage, wherein
the second power level is adjusted to be greater than the first power level to tune gain linearity of the Doherty amplifier device.

19. The method of claim 18, wherein the dynamically adjusting the first and second power levels comprises:
determining one or more parameters from a group including: the ratio of the second gain to the first gain, a present frequency of a presently received input signal, a present envelope amplitude of the presently received input signal, and a present operating power level of the Doherty amplifier device,
searching a look-up table for the one or more parameters,
identifying an optimal resistive value associated with the one or more parameters in the look-up table, and
controlling an adjustable resistive value of the resistive element to the optimal resistive value.

20. The method of claim 19, wherein the dynamically adjusting the first and second power levels further comprises:
identifying an optimal capacitance value also associated with the one or more parameters, wherein the resistive element further comprises a variable capacitance element, and
controlling an adjustable capacitance value of the variable capacitance element to the optimal capacitance value.

\* \* \* \* \*